US008785895B2

(12) United States Patent
Umeda et al.

(10) Patent No.: US 8,785,895 B2
(45) Date of Patent: Jul. 22, 2014

(54) TARGET SUPPLY APPARATUS, CHAMBER, AND EXTREME ULTRAVIOLET LIGHT GENERATION APPARATUS

(71) Applicant: Gigaphoton Inc., Oyama (JP)

(72) Inventors: Hiroshi Umeda, Oyama (JP); Taku Yamazaki, Oyama (JP); Hakaru Mizoguchi, Oyama (JP); Toshihiro Nishisaka, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 13/929,668

(22) Filed: Jun. 27, 2013

(65) Prior Publication Data

US 2014/0008552 A1 Jan. 9, 2014

(30) Foreign Application Priority Data

Jun. 28, 2012 (JP) ................................. 2012-145346

(51) Int. Cl.
*H05G 2/00* (2006.01)
*G03F 7/20* (2006.01)

(52) U.S. Cl.
CPC ............... *H05G 2/008* (2013.01); *H05G 2/001* (2013.01); *H05G 2/006* (2013.01); *G03F 7/20* (2013.01)
USPC ................. 250/504 R; 250/492.1; 250/493.1; 250/492.2; 250/365; 250/423 R

(58) Field of Classification Search
CPC ....... H05G 2/001; H05G 2/003; H05G 2/005; H05G 2/006; H05G 2/008; G03F 7/20; G03F 7/70033
USPC ......... 250/504 R, 492.1, 493.1, 492.2, 423 R, 250/365
See application file for complete search history.

(56) References Cited

U.S. PATENT DOCUMENTS

| | | | | |
|---|---|---|---|---|
| 6,493,423 | B1 * | 12/2002 | Bisschops ..................... | 378/119 |
| 7,122,816 | B2 * | 10/2006 | Algots et al. .............. | 250/504 R |
| 7,368,742 | B2 * | 5/2008 | Hergenhan et al. ....... | 250/504 R |
| 7,405,413 | B2 * | 7/2008 | Hergenhan et al. ........ | 250/492.2 |
| 7,405,416 | B2 * | 7/2008 | Algots et al. ................ | 250/493.1 |
| 7,465,946 | B2 * | 12/2008 | Bowering et al. ......... | 250/504 R |
| 7,608,846 | B2 * | 10/2009 | Nakano ..................... | 250/504 R |
| 7,615,766 | B2 * | 11/2009 | Nakano ..................... | 250/504 R |
| 7,838,854 | B2 * | 11/2010 | Algots et al. .............. | 250/504 R |
| 7,916,388 | B2 * | 3/2011 | Bykanov ..................... | 359/349 |
| 8,003,963 | B2 * | 8/2011 | Nagai et al. ............... | 250/504 R |
| 8,283,643 | B2 * | 10/2012 | Partlo et al. ............... | 250/504 R |
| 8,294,129 | B2 * | 10/2012 | Moriya et al. ............ | 250/504 R |
| 8,462,425 | B2 * | 6/2013 | Hou et al. ................... | 359/333 |
| 8,513,629 | B2 * | 8/2013 | Rajyaguru et al. ........ | 250/504 R |
| 8,604,451 | B2 * | 12/2013 | Yabu et al. ................ | 250/504 R |
| 8,610,095 | B2 * | 12/2013 | Yabu et al. ................ | 250/504 R |
| 8,654,438 | B2 * | 2/2014 | Hou et al. ................... | 359/333 |
| 2010/0258749 | A1 * | 10/2010 | Partlo et al. .............. | 250/504 R |
| 2010/0258750 | A1 * | 10/2010 | Partlo et al. .............. | 250/504 R |

(Continued)

*Primary Examiner* — David A Vanore
(74) *Attorney, Agent, or Firm* — McDermott Will & Emery LLP

(57) ABSTRACT

A target supply apparatus mounted in a chamber in which extreme ultraviolet light is generated by introducing a target material and a laser beam into the chamber may include a target generator having a nozzle, a first pipe configured to cover the nozzle, a cover opening provided in the first pipe to allow the target material to pass through the first pipe, and a first valve configured to open and close the cover opening.

11 Claims, 13 Drawing Sheets

(56) References Cited

U.S. PATENT DOCUMENTS

| | | | |
|---|---|---|---|
| 2011/0233429 A1* | 9/2011 | Vaschenko | 250/492.1 |
| 2012/0091893 A1* | 4/2012 | Yanagida et al. | 315/111.41 |
| 2012/0092746 A1* | 4/2012 | Hou et al. | 359/285 |
| 2012/0286176 A1* | 11/2012 | Rajyaguru et al. | 250/504 R |
| 2012/0313016 A1* | 12/2012 | Fleurov et al. | 250/504 R |
| 2013/0062539 A1* | 3/2013 | Hayashi et al. | 250/504 R |
| 2013/0134326 A1* | 5/2013 | Yabu et al. | 250/455.11 |
| 2013/0146682 A1* | 6/2013 | Ishihara et al. | 239/590 |
| 2013/0186567 A1* | 7/2013 | Yanagida et al. | 156/345.24 |
| 2013/0221587 A1* | 8/2013 | Shiraishi et al. | 266/200 |
| 2013/0228709 A1* | 9/2013 | Umeda et al. | 250/493.1 |
| 2013/0277452 A1* | 10/2013 | Yabu et al. | 239/102.1 |
| 2013/0319466 A1* | 12/2013 | Mizoguchi et al. | 134/18 |
| 2014/0008552 A1* | 1/2014 | Umeda et al. | 250/504 R |
| 2014/0008554 A1* | 1/2014 | Asayama et al. | 250/504 R |
| 2014/0021376 A1* | 1/2014 | Komori et al. | 250/504 R |
| 2014/0042343 A1* | 2/2014 | Vaschenko | 250/504 R |
| 2014/0048099 A1* | 2/2014 | Partlo et al. | 134/1.1 |

* cited by examiner

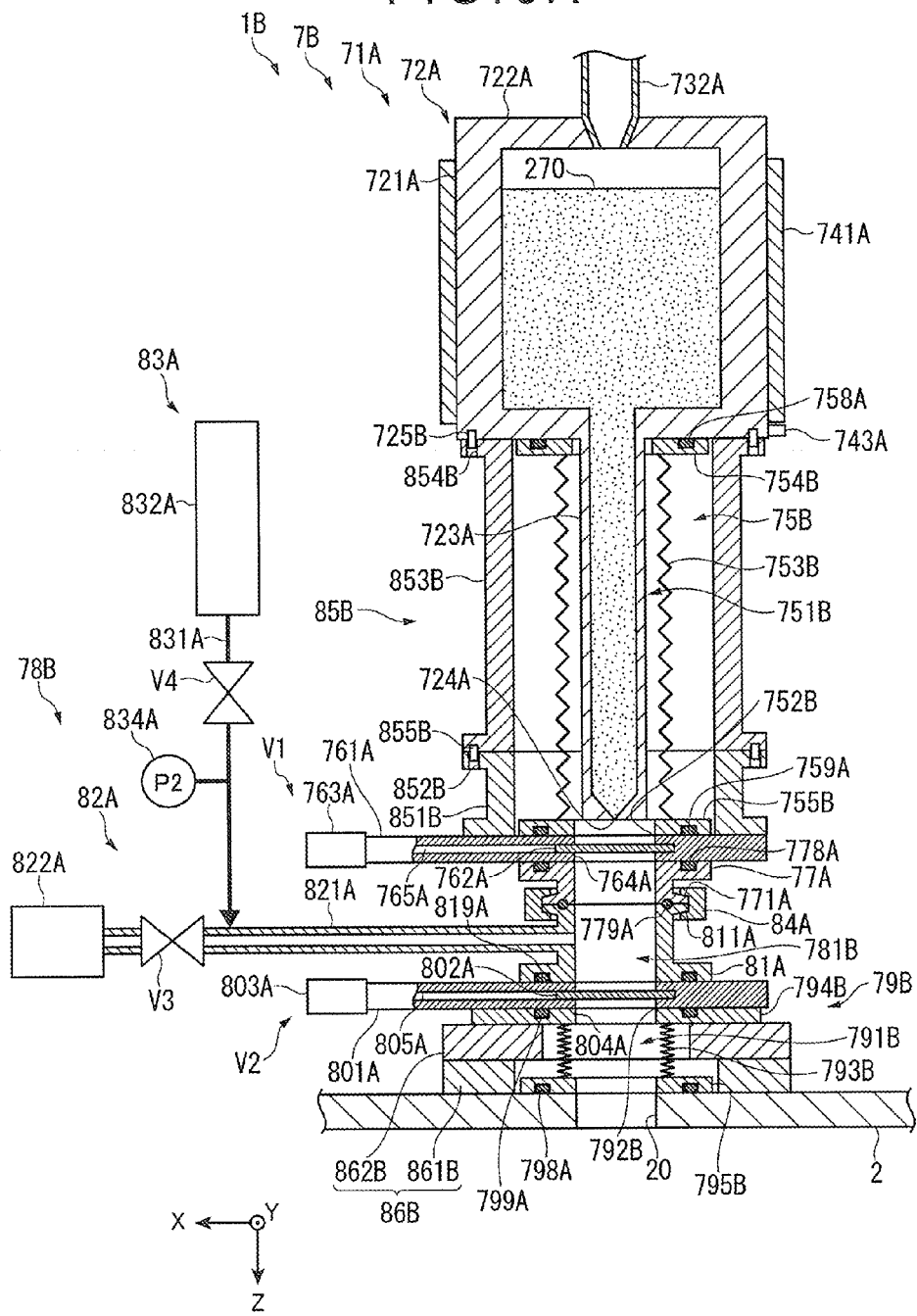

TARGET SUPPLY APPARATUS, CHAMBER, AND EXTREME ULTRAVIOLET LIGHT GENERATION APPARATUS

CROSS-REFERENCE TO A RELATED APPLICATION

The present application claims priority from Japanese Patent Application No. 2012-145346 filed Jun. 28, 2012

BACKGROUND OF THE INVENTION

1. Field of the Invention

The present disclosure relates to target supply apparatuses, chambers, and extreme ultraviolet light generation apparatuses.

2. Description of Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication with feature sizes of 32 nm or less, for example, an exposure apparatus is needed in which a system for generating EUV light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

SUMMARY OF THE INVENTION

A target supply apparatus according to an aspect of the present disclosure is a target supply apparatus mounted in a chamber in which extreme ultraviolet light is generated by introducing a target material and a laser beam into the chamber, and may include a target generator, a cover, a cover opening, and a cover opening/closing section. The target generator may have a nozzle. The cover may be configured to cover the nozzle. The cover opening may be provided in the cover to allow the target material to pass through the cover. The cover opening/closing section may be configured to open and close the cover opening.

A target supply apparatus according to another aspect of the present disclosure is a target supply apparatus mounted in a chamber in which extreme ultraviolet light is generated by introducing a target material and a laser beam into the chamber, and may include a target generator and a nozzle hole opening/closing portion. The target generator may have a nozzle. The nozzle hole opening/closing portion may be configured to open and close a nozzle hole in the nozzle.

A chamber according to an aspect of the present disclosure may include a chamber main body, a target supply apparatus, and a chamber opening/closing section. The chamber main body may include a chamber opening. The target supply apparatus may be configured to introduce a target material into the chamber main body through the chamber opening. The chamber opening/closing section may be configured to open and close the chamber opening.

An extreme ultraviolet light generation apparatus according to an aspect of the present disclosure is an extreme ultraviolet light generation apparatus that generates extreme ultraviolet light by introducing a target material and a laser beam, and may include a target generator, a chamber main body, a chamber opening/closing section, a cover, a cover opening, and a cover opening/closing section. The target generator may include a nozzle. The chamber main body may have a chamber opening through which the target material is introduced. The chamber opening/closing section may be configured to open and close the chamber opening. The cover may be configured to cover the nozzle. The cover opening may be provided in the cover to allow the target material to pass through the cover. The cover opening/closing section may be configured to open and close the cover opening.

BRIEF DESCRIPTION OF THE DRAWINGS

Hereinafter, selected embodiments of the present disclosure will be described with reference to the accompanying drawings.

FIG. 6A illustrates the overall configuration of a target supply apparatus according to a second embodiment, and illustrates a state in which the target supply apparatus is mounted.

DESCRIPTION OF EMBODIMENT(S)

Contents

Figure 1:
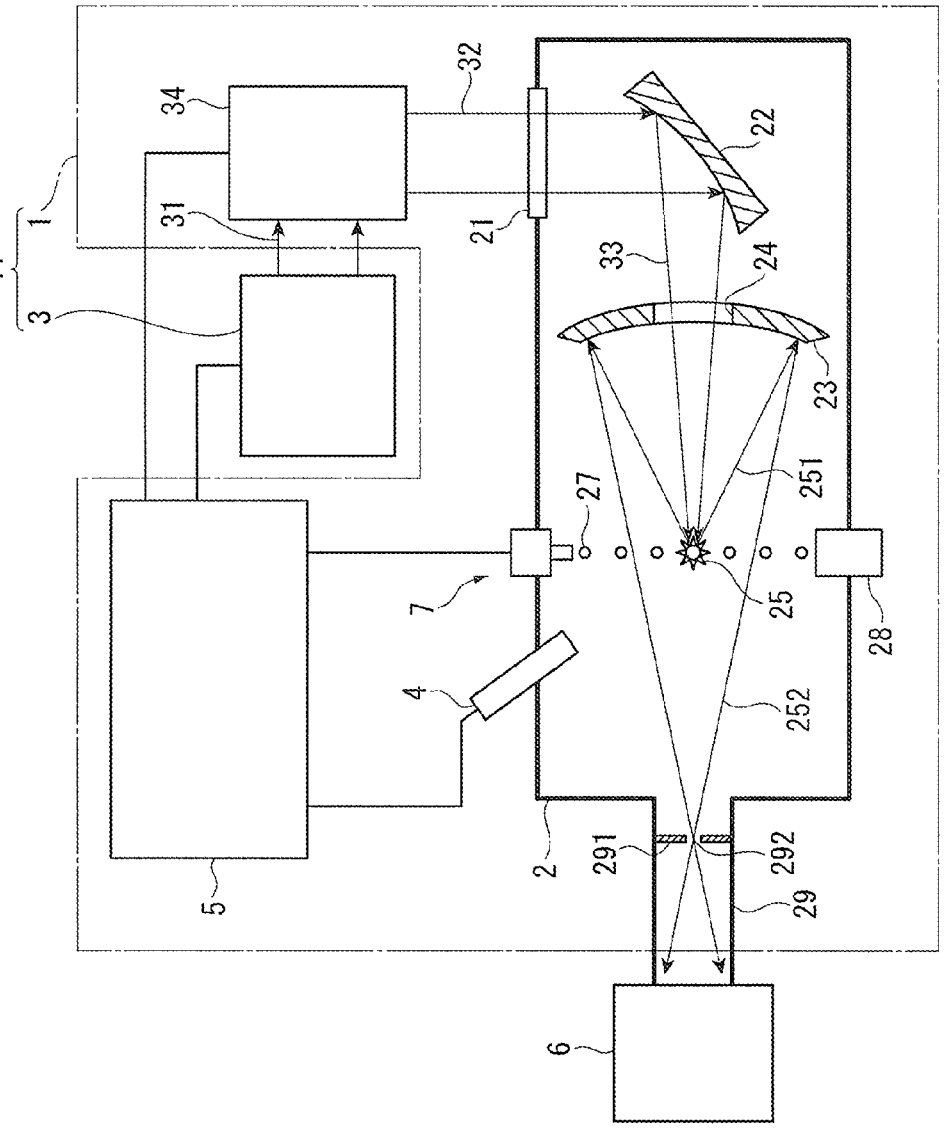
FIG. 1 illustrates the overall configuration of an exemplary LPP-type EUV light generation apparatus.

1. Overview of EUV Light Generation Apparatus
1.1 Configuration
1.2 Operation

2. EUV Light Generation Apparatus Including Target Supply Apparatus
2.1 First Embodiment
2.1.1 Overview
2.1.2 Configuration
2.1.3 Operation
2.1.3.1 Operations when Installing Target Generator in Chamber
2.1.3.2 Operations when Removing Target Generator from Chamber
2.2 Second Embodiment
2.2.1 Overview
2.2.2 Configuration
2.2.3 Operation
2.2.3.1 Operations when Installing Target Generator in Chamber
2.2.3.2 Operations when Removing Target Generator from Chamber
2.3 Third Embodiment
2.3.1 Overview
2.3.2 Configuration
2.3.3 Operation
2.3.3.1 Operations when Installing Target Generator in Chamber
2.3.3.2 Operations when Removing Target Generator from Chamber
2.4 Fourth Embodiment
2.4.1 Overview
2.4.2 Configuration
2.4.3 Operation
2.4.3.1 Operations when Installing Target Generator in Chamber
2.4.3.2 Operations when Removing Target Generator from Chamber
2.5 Variations Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

1. Overview of EUV Light Generation System 1.1 Configuration

FIG. 1 schematically illustrates an exemplary configuration of an LPP type EUV light generation system. An EUV light generation apparatus 1 may be used with at least one laser apparatus 3. Hereinafter, a system that includes the EUV light generation apparatus 1 and the laser apparatus 3 may be referred to as an EUV light generation system 11. As shown in FIG. 1 and described in detail below, the EUV light generation system 11 may include a chamber 2 and a target supply device 7. The chamber 2 may be sealed airtight. The target supply device 7 may be mounted onto the chamber 2, for example, to penetrate a wall of the chamber 2. A target material to be supplied by the target supply device 7 may include, but is not limited to, tin, terbium, gadolinium, lithium, xenon, or any combination thereof.

The chamber 2 may have at least one through-hole or opening formed in its wall, and a pulse laser beam 32 may travel through the through-hole/opening into the chamber 2. Alternatively, the chamber 2 may have a window 21, through which the pulse laser beam 32 may travel into the chamber 2. An EUV collector mirror 23 having a spheroidal surface may, for example, be provided in the chamber 2. The EUV collector mirror 23 may have a multi-layered reflective film formed on the spheroidal surface thereof. The reflective film may include a molybdenum layer and a silicon layer, which are alternately laminated. The EUV collector mirror 23 may have a first focus and a second focus, and may be positioned such that the first focus lies in a plasma generation region 25 and the second focus lies in an intermediate focus (IF) region 292 defined by the specifications of an external apparatus, such as an exposure apparatus 6. The EUV collector mirror 23 may have a through-hole 24 formed at the center thereof so that a pulse laser beam 33 may travel through the through-hole 24 toward the plasma generation region 25.

The EUV light generation system 11 may further include an EUV light generation controller 5 and a target sensor 4. The target sensor 4 may have an imaging function and detect at least one of the presence, trajectory, position, and speed of a target 27.

Further, the EUV light generation system 11 may include a connection part 29 for allowing the interior of the chamber 2 to be in communication with the interior of the exposure apparatus 6. A wall 291 having an aperture 293 may be provided in the connection part 29. The wall 291 may be positioned such that the second focus of the EUV collector mirror 23 lies in the aperture 293 formed in the wall 291.

The EUV light generation system 11 may also include a laser beam direction control unit 34, a laser beam focusing mirror 22, and a target collector 28 for collecting targets 27. The laser beam direction control unit 34 may include an optical element (not separately shown) for defining the direction into which the pulse laser beam 32 travels and an actuator (not separately shown) for adjusting the position and the orientation or posture of the optical element.

1.2 Operation

With continued reference to FIG. 1, a pulse laser beam 31 outputted from the laser apparatus 3 may pass through the laser beam direction control unit 34 and be outputted therefrom as the pulse laser beam 32 after having its direction optionally adjusted. The pulse laser beam 32 may travel through the window 21 and enter the chamber 2. The pulse laser beam 32 may travel inside the chamber 2 along at least one beam path from the laser apparatus 3, be reflected by the laser beam focusing mirror 22, and strike at least one target 27 as a pulse laser beam 33.

The target supply device 7 may be configured to output the target (s) 27 toward the plasma generation region 25 in the chamber 2. The target 27 may be irradiated with at least one pulse of the pulse laser beam 33. Upon being irradiated with the pulse laser beam 33, the target 27 may be turned into plasma, and rays of light 251 including EUV light may be emitted from the plasma. At least the EUV light included in the light 251 may be reflected selectively by the EUV collector mirror 23. EUV light 252, which is the light reflected by the EUV collector mirror 23, may travel through the intermediate focus region 292 and be outputted to the exposure apparatus 6. Here, the target 27 may be irradiated with multiple pulses included in the pulse laser beam 33.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control at least one of: the timing when the target 27 is outputted and the direction into which the target 27 is outputted. Furthermore, the EUV light generation controller 5 may be configured to control at least one of: the timing when the laser apparatus 3 oscillates, the direction in which the pulse laser beam 33 travels, and the position at which the pulse laser beam 33 is focused. It will be appreciated that the various controls mentioned above are merely examples, and other controls may be added as necessary.

2. EUV Light Generation Apparatus Including Target Supply Apparatus

2.1 First Embodiment

2.1.1 Overview

According to a first embodiment of the present disclosure, a target supply apparatus may include a tank and a target generator having a nozzle provided so as to communicate with the interior of the tank and protrude from a surface of the tank. Furthermore, a cover may be formed as a cylinder extending from the tank to a leading end of the nozzle, and may be provided so that an internal space surrounded by the cover, a cover opening/closing section, and the tank is made airtight by the cover opening/closing section closing the cover opening.

Here, when a nozzle hole of the nozzle makes contact with air, target material present in the nozzle hole or on the leading end of the nozzle can oxidize and produce solidified oxidants. The solidified oxidants can cause the nozzle hole to become clogged, the target material to be outputted in an unintended direction, and so on.

According to the aforementioned target supply apparatus, the internal space surrounded by the cover, the cover opening/closing section, and the tank can be made airtight by closing the cover opening after the target material has been supplied. Accordingly, the target generator can be removed from the chamber while suppressing the nozzle hole from coming into contact with air.

In addition, according to a first embodiment of the present disclosure, the target supply apparatus may include a first connecting pipe provided so as to communicate with the interior of the cover via the cover opening, a second connecting pipe provided in the first connecting pipe in a removable state, so as to communicate with the interior of the first connecting pipe, a chamber opening/closing section, provided on an end of the second connecting pipe on the opposite side to the first connecting pipe, configured to introduce the target material, and open and close the chamber opening, and an exhaust section configured to exhaust the interior of the first connecting pipe, the interior of the second connecting pipe, and the interior of the cover.

According to this target supply apparatus, the target generator can be installed in the chamber in a state in which the chamber opening is closed by the chamber opening/closing section. When installing the target generator, the first connecting pipe can be connected to the second connecting pipe in a state in which the cover opening is closed by the cover opening/closing section. After this, the exhaust section can exhaust air from the interior of the first connecting pipe, the interior of the second connecting pipe, and the interior of the cover. By the chamber opening/closing section opening the chamber opening and the cover opening/closing section opening the cover opening after the air has been exhausted, the target material can be supplied into the chamber.

Accordingly, the target generator can be installed in the chamber while suppressing the nozzle hole from coming into contact with air.

Furthermore, according to the first embodiment of the present disclosure, the target supply apparatus may have a purge gas supply section configured to supply a purge gas to the interior of the first connecting pipe, the interior of the second connecting pipe, and the interior of the cover.

According to this target supply apparatus, when removing the target generator from the chamber, the exhaust section can exhaust etchant gas from the interior of the first connecting pipe, the interior of the second connecting pipe, and the interior of the cover, while the chamber opening and the cover opening are open. Then, after the etchant gas has been exhausted, the chamber opening/closing section can close the chamber opening and the purge gas supply section can supply the purge gas to the interior of the first connecting pipe, the interior of the second connecting pipe, and the interior of the cover. By the cover opening/closing section then closing the cover opening, the internal space surrounded by the cover, the cover opening/closing section, and the tank can be made airtight while filled with the purge gas.

Accordingly, the target generator can be removed from the chamber while suppressing the nozzle hole from coming into contact with air. Furthermore, because the internal space surrounded by the cover, the cover opening/closing section, and the tank can be filled with the purge gas, air can be suppressed from entering into the internal space due to a pressure difference between the inside and the outside of the cover.

Furthermore, according to the first embodiment of the present disclosure, the target supply apparatus may have an anchoring portion configured to position and anchor the first connecting pipe and the second connecting pipe.

According to this target supply apparatus, the first connecting pipe and the second connecting pipe can be suppressed from being connected with positional skew. Accordingly, air can be suppressed from entering into the chamber from a gap produced by such positional skew. In addition, the nozzle hole can be suppressed from coming into contact with air.

2.1.2 Configuration

Figure 2:
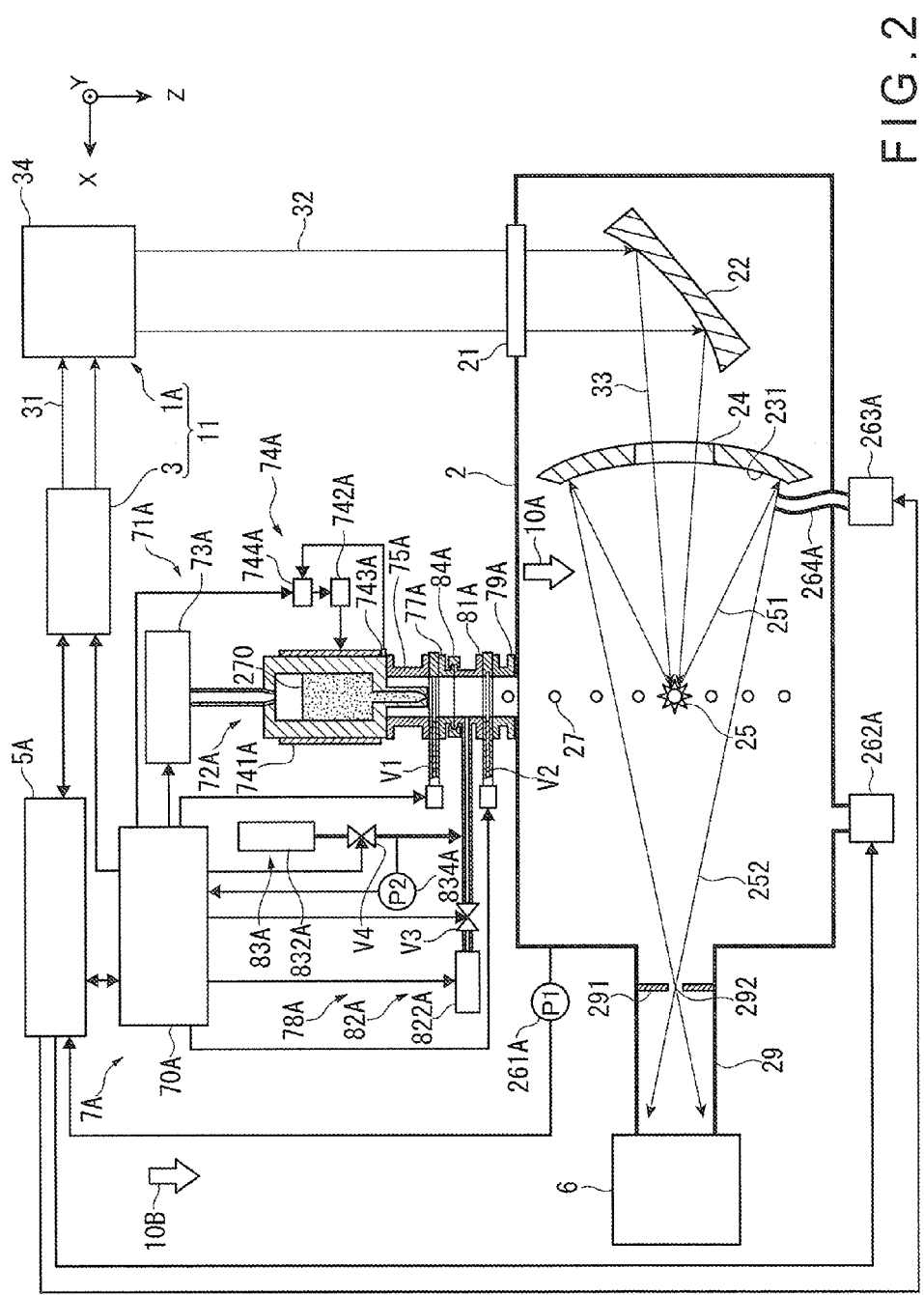
FIG. 2 illustrates the overall configuration of an EUV light generation apparatus that includes a target supply apparatus according to a first embodiment.
Figure 3:
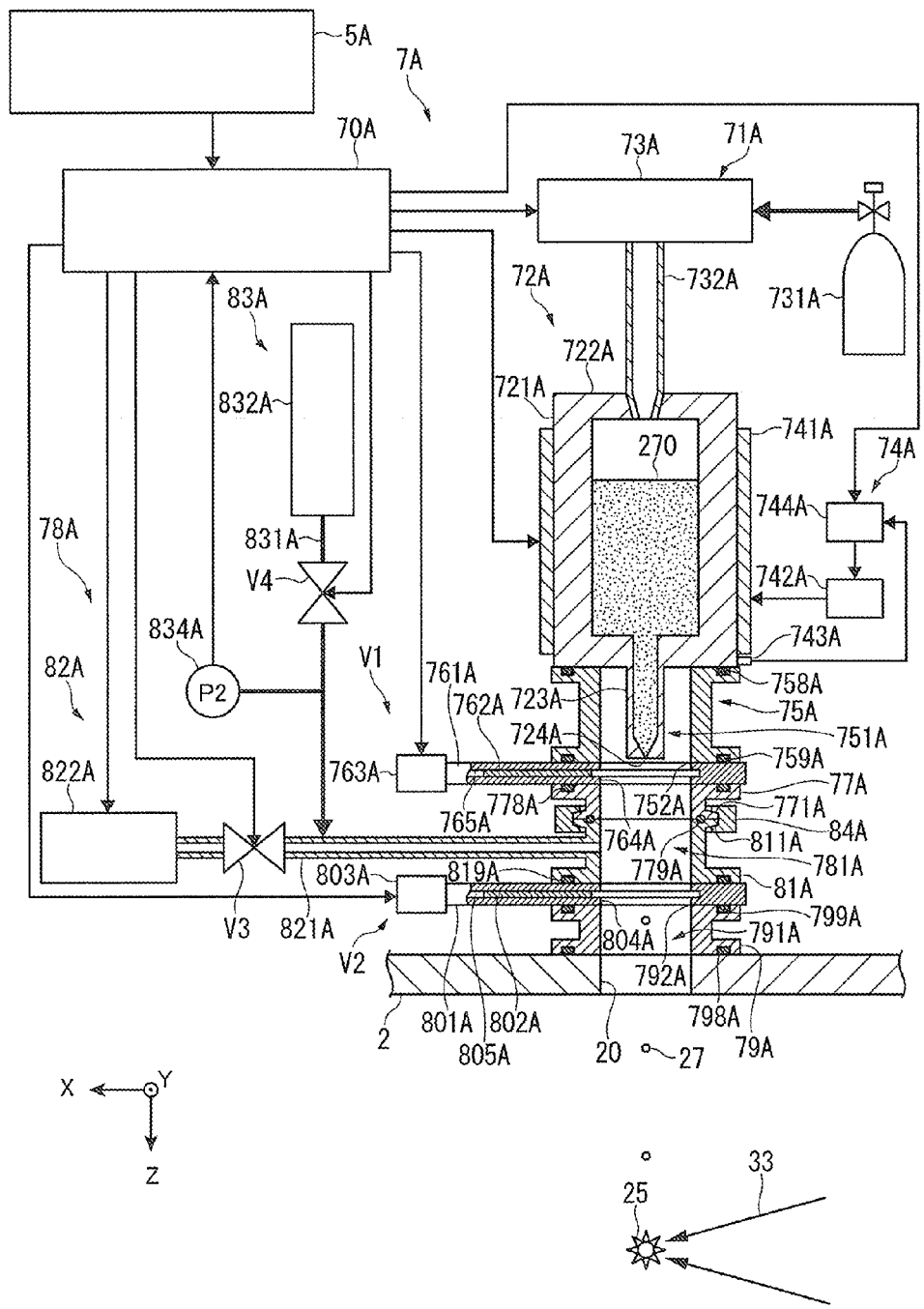
FIG. 3 illustrates the overall configuration of a target supply apparatus.

FIG. 2 illustrates the overall configuration of an EUV light generation apparatus that includes a target supply apparatus according to the first embodiment. FIG. 3 illustrates the overall configuration of the target supply apparatus.

An EUV light generation apparatus 1A may, as shown in FIG. 2, include a chamber 2, a laser apparatus 3, an EUV light generation control system 5A, and a target supply apparatus 7A.

A first pressure sensor 261A that detects a pressure within the chamber 2, a first exhaust apparatus 262A that exhausts the interior of the chamber 2, and an etchant gas supply section 263A that supplies an etchant gas to the interior of the chamber 2 may be provided in the chamber 2.

The first pressure sensor 261A and the first exhaust apparatus 262A may be connected to the EUV light generation control system 5A. The first pressure sensor 261A may send a signal corresponding to the pressure within the chamber 2 to the EUV light generation control system 5A. The first exhaust apparatus 262A may exhaust the interior of the chamber 2 based on a signal sent from the EUV light generation control system 5A.

A pipe 264A for supplying the etchant gas along a reflective surface 231 of the EUV collector mirror 23 may be connected to the etchant gas supply section 263A. The etchant gas supply section 263A may be electrically connected to the EUV light generation control system 5A. The etchant gas supply section 263A may supply an etchant gas to the interior of the chamber 2 based on a signal sent from the EUV light generation control system 5A.

Here, the etchant gas supplied by the etchant gas supply section 263A may be any gas capable of etching a target material, which is the primary constituent material of the debris, and may be selected as appropriate based on the target material. For example, the etchant gas may be hydrogen radicals or a halogen gas. The etchant gas may be a radicalized gas or a non-radicalized gas.

The target supply apparatus 7A may include a target control apparatus 70A, a target generation section 71A, a first pipe 75A, a first valve V1, a second pipe 77A serving as a first connecting pipe, and a connection section 78A.

The target generation section 71A may include a target generator 72A, a pressure adjuster 73A, and a temperature adjustment unit 74A.

As shown in FIG. 3, the target generator 72A may include a tank 721A for holding a target material 270 in its interior.

The tank 721A may be cylindrical in shape. A nozzle 723A through which the target material 270 within the tank 721A passes through before being outputted as the droplet 27 into the chamber 2 may be provided in the tank 721A. A nozzle hole 724A may be provided in a leading end of the nozzle 723A.

An inert gas tank 731A may be connected to the pressure adjuster 73A. The pressure adjuster 73A may be connected to the target generator 72A via a pipe 732A that passes through a wall 722A in the tank 721A that is close to the pressure adjuster 73A. The pressure adjuster 73A may be configured so as to adjust the pressure within the target generator 72A by controlling the pressure of an inert gas supplied from the inert gas tank 731A. The inert gas may be a noble gas such as argon or nitrogen.

The temperature adjustment unit 74A may be configured to adjust the temperature of the target material 270 within the tank 721A. The temperature adjustment unit 74A may include a heater 741A, a heater power source 742A, a temperature sensor 743A, and a temperature controller 744A. The heater 741A may be provided on an outer circumferential surface of the tank 721A. The heater power source 742A may cause the heater 741A to produce heat by supplying power to the heater 741A based on a signal from the temperature controller 744A. As a result, the target material 270 within the tank 721A can be heated.

The temperature sensor 743A may be provided on the outer circumferential surface of the tank 721A, toward the location of the nozzle 723A. The temperature sensor 743A may be configured to detect a temperature at an area where the sensor is installed and send a signal corresponding to the detected temperature to the temperature controller 744A. The temperature controller 744A may be configured to estimate the temperature of the target material 270 based on the signal from the temperature sensor 743A and output, to the heater power source 742A, a signal for adjusting the temperature of the target material 270 to a predetermined temperature.

The first pipe 75A may serve as a cover, and may be provided so as to cover at least part of at least the nozzle 723A of the target generator 72A. The first pipe 75A may have a pair of flanges. The pair of flanges may be provided on both ends of the first pipe 75A so as to extend outward from the pipe.

The first pipe 75A may be anchored to a base surface of the tank 721A so that at least part of the nozzle 723A is positioned within a first internal space 751A of the first pipe 75A and so that the leading end of the nozzle 723A is positioned closer to the tank 721A than a cover opening 752A at the end of the first pipe 75A in a Z direction shown in FIG. 3. Here, a seal may be formed between a first surface of the first pipe 75A and a second surface of the tank 721A by embedding an O-ring 758A in a groove provided in the flange at a first end.

The first valve V1 serves as a cover opening/closing section, and may open/close the cover opening 752A of the first pipe 75A. The first valve V1 may be a gate valve. The first valve V1 may include a guide portion 761A anchored to a second end of the first pipe 75A, a shield plate 762A provided so as to be capable of moving along the guide portion 761A, and a driving unit 763A that drives the shield plate 762A.

The guide portion 761A may be formed in, for example, an appropriate plate shape whose outer profile is greater than the cover opening 752A. A through-hole 764A may be formed in the guide portion 761A, passing therethrough in a thickness direction thereof. The size of the through-hole 764A may be the same as the size of the cover opening 752A, or may be at least a size that allows the droplet 27 to pass therethrough. A first groove 765A may be formed on the inside of the guide portion 761A. The first groove 765A may guide the shield plate 762A so that the shield plate 762A can move back and forth between a first position where the through-hole 764A is covered and a second position where the through-hole 764A is uncovered.

The driving unit 763A may be electrically connected to the target control apparatus 70A. The driving unit 763A may move the shield plate 762A to the first position or the second position based on a signal sent from the target control apparatus 70A.

The first valve V1 may be anchored to the second end of the first pipe 75A so that the center of the through-hole 764A is positioned coaxially to the center of the cover opening 752A of the first pipe 75A. Here, a seal may be formed between a second surface of the first pipe 75A and a first surface of the guide portion 761A in the first valve V1 by embedding an O-ring 759A in a groove provided in the flange at the second end. Through this configuration, the cover opening 752A can be closed when the shield plate 762A is in the first position, and the cover opening 752A can be opened when the shield plate 762A is in the second position.

The second pipe 77A may be provided on the opposite side of the first valve V1 to the first pipe 75A. The second pipe 77A may have a pair of flanges. The pair of flanges may be provided on both ends of the second pipe 77A so as to extend outward from the pipe.

An inner diameter dimension of the second pipe 77A may be the same as an inner diameter dimension of the first pipe 75A, or may be at least a size that allows the droplet 27 to pass therethrough. The second pipe 77A may be anchored to a second surface of the guide portion 761A so that the center axis of the second pipe 77A is positioned coaxially to the center axis of the first pipe 75A and the center axis of the through-hole 764A. A seal may be formed between a first surface of the second pipe 77A and the second surface of the guide portion 761A by embedding an O-ring 778A in a groove provided in the flange at a first end of the second pipe 77A.

The connection section 78A may include a third pipe 79A, a second valve V2 serving as a chamber opening/closing section, a fourth pipe 81A serving as a second connecting pipe, a second exhaust section 82A, a purge gas supply section 83A, and a joint 84A serving as an anchoring portion.

The third pipe 79A may be provided on a first surface on an outer side of the chamber 2. The third pipe 79A may have the same configuration as the first pipe 75A, and may have a pair of flanges on both ends of the third pipe 79A in the axial direction thereof that extend outward from the pipe.

An inner diameter dimension of the third pipe 79A may be the same as an inner diameter dimension of the first pipe 75A, or may be at least a size that allows the droplet 27 to pass therethrough. The third pipe 79A may be anchored to the first surface on the outer side of the chamber 2 so that the center axis of the third pipe 79A is positioned coaxially to the center of a chamber opening 20 in the chamber 2. A seal may be formed between a second surface of the third pipe 79A and the first surface on the outer side of the chamber 2 by embedding an O-ring 798A in a groove provided in the flange at a second end of the third pipe 79A.

The second valve V2 may open/close a cover opening 792A on a first end of the third pipe 79A. The second valve V2 may be the same type of a gate valve as the first valve V1. The second valve V2 may include a guide portion 801A, a shield plate 802A, and a driving unit 803A, like the guide portion 761A, the shield plate 762A, and the driving unit 763A. Furthermore, the guide portion 801A may have a through-hole 804A and a second groove 805A, like the through-hole 764A and the first groove 765A.

The driving unit 803A may be electrically connected to the target control apparatus 70A, and may move the shield plate 802A to the first position or the second position based on a signal sent from the target control apparatus 70A.

The second valve V2 may be anchored to the flange on the first end of the third pipe 79A so that the center of the through-hole 804A is positioned coaxially to the center of the opening 792A of the third pipe 79A and the center of the chamber opening 20 in the chamber 2. A seal may be formed between a first surface of the third pipe 79A and a second surface of the guide portion 801A by embedding an O-ring 799A in a groove provided in the flange at the first end of the third pipe 79A. Through this configuration, the chamber opening 20 can be closed when the shield plate 802A is in the first position, and the chamber opening 20 can be opened when the shield plate 802A is in the second position.

The fourth pipe 81A may be provided on the opposite side of the second valve V2 to the third pipe 79A. The fourth pipe 81A may have the same configuration as the second pipe 77A, and may have a pair of flanges on both ends of the fourth pipe 81A in the axial direction thereof that extend outward from the pipe. The fourth pipe 81A may be anchored to a first surface of the guide portion 801A so that the center axis of the fourth pipe 81A is positioned coaxially to the center axis of the through-hole 804A and the center axis of the opening 792A. A seal may be formed between a second surface of the fourth pipe 81A and the first surface of the guide portion 801A by embedding an O-ring 819A in a groove provided in the flange at a second end of the fourth pipe 81A.

The role of the second exhaust section 82A will now be described. When the second pipe 77A and the fourth pipe 81A are positioned and anchored to each other by the joint 84A, a second internal space 781A is formed by the second pipe 77A, the fourth pipe 81A, the shield plate 762A of the first valve V1, and the shield plate 802A of the second valve V2. The second exhaust section 82A may exhaust the second internal space 781A. The second exhaust section 82A may include a pipe 821A, a second exhaust apparatus 822A, and a third valve V3.

A first end of the pipe 821A may be passed into the fourth pipe 81A.

The second exhaust apparatus 822A may be connected to a second end of the pipe 821A. The second exhaust apparatus 822A may be electrically connected to the target control apparatus 70A. The second exhaust apparatus 822A may exhaust the second internal space 781A based on a signal sent from the target control apparatus 70A.

The third valve V3 may be provided in the pipe 821A. The third valve V3 may be electrically connected to the target control apparatus 70A, and based on a signal sent from the target control apparatus 70A, may switch between an open state that allows the second internal space 781A to be exhausted and a closed state that prevents the second internal space 781A from being exhausted.

The purge gas supply section 83A may supply a purge gas to the second internal space 781A. The purge gas supply section 83A may include a pipe 831A, a purge gas supply source 832A, a fourth valve V4, and a second pressure sensor 834A.

A first end of the pipe 831A may be passed into the pipe 821A at a location that is closer to the fourth pipe 81A than the third valve V3.

The purge gas supply source 832A may be connected to a second end of the pipe 831A. The purge gas supply source 832A may supply the purge gas to the second internal space 781A via the pipe 831A and the pipe 821A. The purge gas may be a gas that does not easily react with tin, which is used as the target material 270, and may be, for example, nitrogen gas, argon gas, helium gas, or the like.

The fourth valve V4 may be provided in the pipe 831A. The fourth valve V4 may be electrically connected to the target control apparatus 70A, and based on a signal sent from the target control apparatus 70A, may switch between an open state that allows the purge gas to be supplied to the second internal space 781A and a closed state that prevents the purge gas from being supplied to the second internal space 781A.

The second pressure sensor 834A may be provided in the pipe 831A in a location closer to the pipe 821A than the fourth valve V4, and may be electrically connected to the target control apparatus 70A. The second pressure sensor 834A may send a signal corresponding to a pressure in the second internal space 781A to the target control apparatus 70A.

The joint 84A may be, for example, a quick coupling. The joint 84A may position and anchor the second pipe 77A and the fourth pipe 81A to each other by nipping and anchoring a flange 771A on a second end of the second pipe 77A and a flange 811A on a first end of the fourth pipe 81A. The surface of the second end of the second pipe 77A and the surface of the first end of the fourth pipe 81A may be sealed by disposing an O-ring 779A between the flange 771A at the second end of the second pipe 77A and the flange 811A at the first end of the fourth pipe 81A.

Depending on how the chamber 2 shown in FIG. 2 is arranged, it is not necessarily the case that a pre-set output direction for the target material 270 (the axial direction of the nozzle 723A (called a "set output direction 10A")) will match a gravitational direction 10B. The configuration may be such that the target material 270 is outputted at an angle or horizontally relative to the gravitational direction 10B. In the drawings illustrating the first embodiment and second to fourth embodiments that will be described later, the chamber 2 is installed so that the set output direction 10A matches the gravitational direction 10B.

2.1.3 Operation 2.1.3.1 Operations when Installing Target Generator in Chamber

Figure 4:
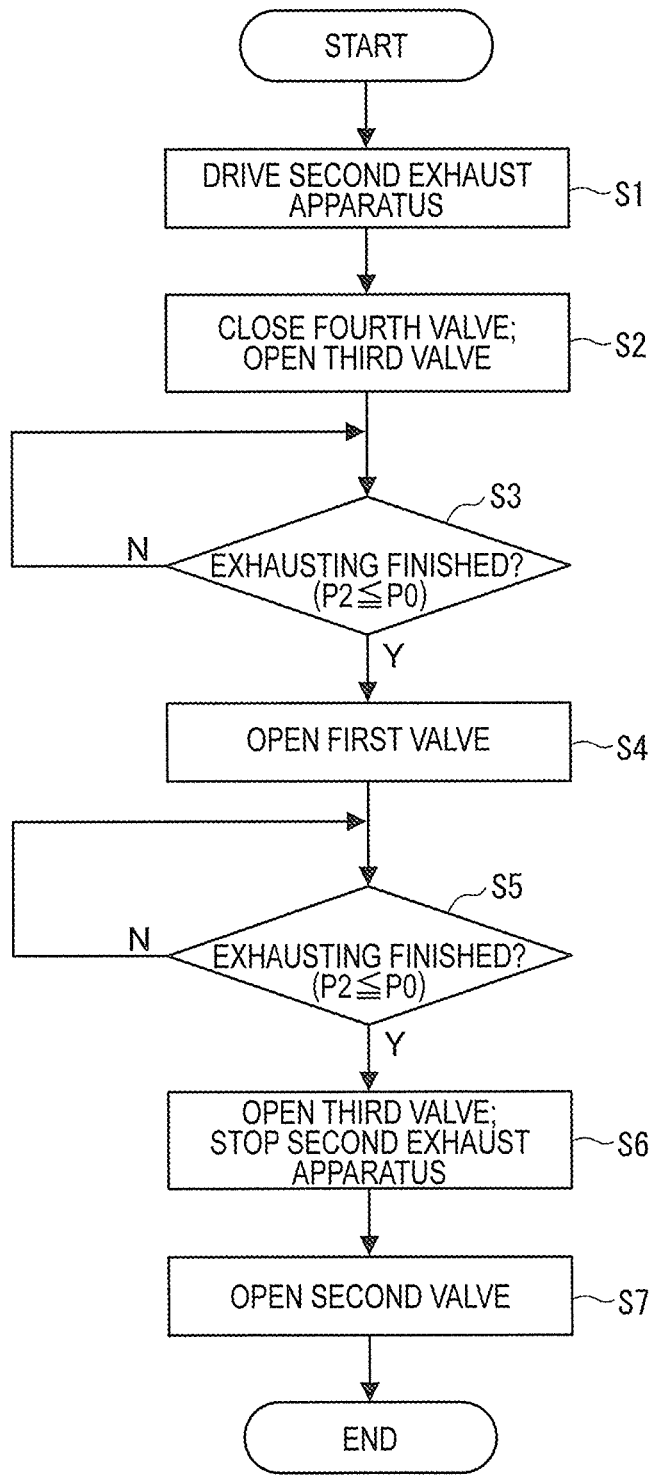
FIG. 4 is a flowchart illustrating operations performed when a target generator is installed in a chamber.

FIG. 4 is a flowchart illustrating operations performed when the target generator is installed in the chamber.

The second valve V2 may close the opening 792A of the third pipe 79A before the target generator 72A is installed in the chamber 2. In addition, at this time, the interior of the chamber 2 may be filled with a gas. This gas may be an etchant gas for etching debris.

Meanwhile, the first valve V1 may close the cover opening 752A of the first pipe 75A before the target generator 72A is installed in the chamber 2. The fourth valve V4 may be open. The third valve V3 may be closed. The first internal space 751A may be filled with the purge gas. Although details will be given later, the purge gas may be filled before the target generator 72A is removed from the chamber 2.

An operator may place the flange 771A of the second pipe 77A on the flange 811A of the fourth pipe 81A, and then position and anchor the flange 771A of the second pipe 77A and the flange 811A of the fourth pipe 81A to each other using the joint 84A. A seal can be formed between the second pipe 77A and the fourth pipe 81A, and the airtight second internal space 781A can be formed, by disposing the O-ring 799A prior to placing the flange 771A on the flange 811A. Because the aforementioned operations are carried out in air, air can be present in the second internal space 781A.

Upon receiving a signal from the EUV light generation control system 5A, the target control apparatus 70A may drive the second exhaust apparatus 822A of the second exhaust section 82A, as shown in FIG. 4 (step S1). After this, the target control apparatus 70A may close the fourth valve V4 and open the third valve V3 (step S2). The air present in the second internal space 781A can be exhausted as a result of the processes of steps S1 and S2. The second pressure sensor 834A may then send a signal corresponding to the pressure in the second internal space 781A to the target control apparatus 70A.

The target control apparatus 70A may determine whether or not the exhausting of the second internal space 781A has finished based on a signal sent from the second pressure sensor 834A (step S3). For example, in the case where a pressure P2 measured by the second pressure sensor 834A has dropped to or below a pre-set threshold P0, the target control apparatus 70A may determine that the exhausting has finished, whereas in the case where the pressure P2 is not at or below the threshold P0, the target control apparatus 70A may determine that the exhausting has not finished.

In the case where the target control apparatus 70A has determined in step S3 that the exhausting of the second internal space 781A is not finished, the process of step S3 may be carried out once again after a predetermined amount of time has elapsed.

On the other hand, in the case where the target control apparatus 70A has determined in step S3 that the exhausting of the second internal space 781A has finished, the first valve V1 may be opened (step S4). The nozzle hole 724A of the nozzle 723A can be suppressed from making contact with air by opening the first valve V1 after the exhausting of the second internal space 781A has finished.

The target control apparatus 70A may determine whether or not the exhausting of the first internal space 751A has finished based on a signal sent from the second pressure sensor 834A (step S5). For example, in the case where the pressure P2 measured by the second pressure sensor 834A has dropped to or below the threshold P0, the target control apparatus 70A may determine that the exhausting has finished, whereas in the case where the pressure P2 is not at or below the threshold P0, the target control apparatus 70A may determine that the exhausting has not finished. The threshold P0 used in step S5 may be the same as the threshold P0 used in step S3, or may be different.

In the case where the target control apparatus 70A has determined in step S5 that the exhausting of the purge gas from the first internal space 751A is not finished, the process of step S5 may be carried out once again after a predetermined amount of time has elapsed.

On the other hand, in the case where the target control apparatus 70A has determined in step S5 that the exhausting of the first internal space 751A has finished, the third valve V3 may be closed and the second exhaust apparatus 822A may be stopped (step S6).

Both the first internal space 751A and the second internal space 781A can be exhausted as a result of the aforementioned processes.

After this, the target control apparatus 70A may open the second valve V2 (step S7). Through the aforementioned processes, the target generator 72A can be installed in the chamber 2 without the nozzle hole 724A of the nozzle 723A making contact with air. The EUV light generation apparatus 1A can generate the EUV light 251 by performing a process for outputting the droplet 27 into the chamber 2 and so on.

2.1.3.2 Operations when Removing Target Generator from Chamber

Figure 5:
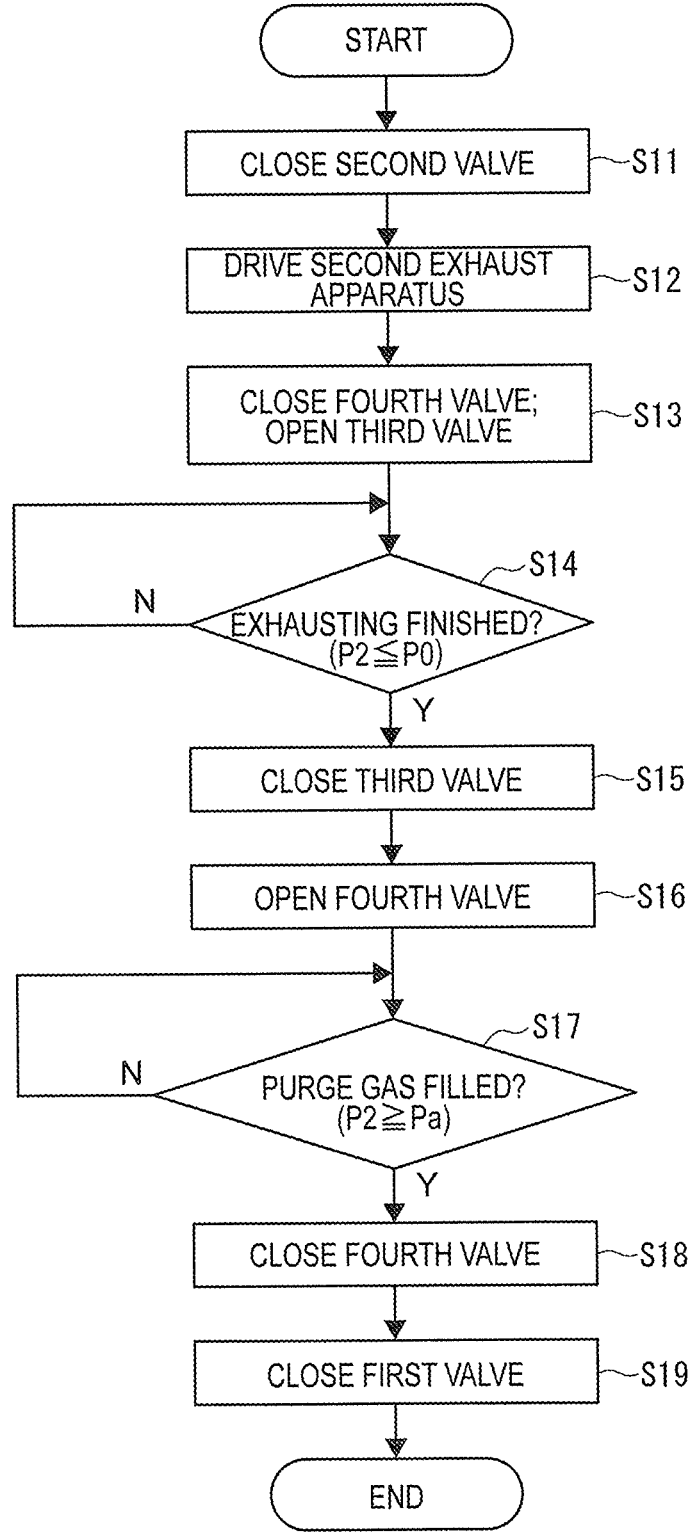
FIG. 5 is a flowchart illustrating operations performed when a target generator is removed from a chamber.

FIG. 5 is a flowchart illustrating operations performed when the target generator is removed from the chamber.

The chamber 2, the first internal space 751A, and a third internal space 791A in the third pipe 79A may be filled with the etchant gas before the target generator 72A is removed from the chamber 2.

After this, the operator may operate the EUV light generation apparatus 1A for the purpose of removing the target generator 72A from the chamber 2.

Based on the operation performed by the operator, the EUV light generation control system 5A of the EUV light generation apparatus 1A may send a signal for removing the target generator 72A from the chamber 2 to the target control apparatus 70A.

Upon receiving a signal from the EUV light generation control system 5A, the target control apparatus 70A may close the second valve V2, as shown in FIG. 5 (step S11). After this, the target control apparatus 70A may drive the second exhaust apparatus 822A (step S12). Furthermore, the target control apparatus 70A may close the fourth valve V4 and open the third valve V3 (step S13). The etchant gas present in the first internal space 751A and the second internal space 781A can be exhausted as a result of the processes of steps S11 to S13. The second pressure sensor 834A may then send a signal corresponding to the pressures in the first internal space 751A and the second internal space 781A to the target control apparatus 70A.

The target control apparatus 70A may determine whether or not the exhausting of the first internal space 751A and the second internal space 781A has finished based on a signal sent from the second pressure sensor 834A (step S14).

In the case where the target control apparatus 70A has determined in step S14 that the exhausting of the first internal space 751A and the second internal space 781A is not finished, the process of step S14 may be carried out once again after a predetermined amount of time has elapsed.

On the other hand, in the case where the target control apparatus 70A has determined in step S14 that the exhausting of the first internal space 751A and the second internal space 781A has finished, the third valve V3 may be closed and the second exhaust apparatus 822A may be stopped (step S15). Furthermore, the target control apparatus 70A may open the fourth valve V4 (step S16).

The purge gas from the purge gas supply source 832A can be supplied to the first internal space 751A and the second internal space 781A as a result of the processes of steps S15 and S16. The second pressure sensor 834A may then send a signal corresponding to the pressure in the first internal space 751A and the second internal space 781A to the target control apparatus 70A.

The target control apparatus 70A may determine whether or not the first internal space 751A and the second internal space 781A have been filled with the purge gas based on a signal sent from the second pressure sensor 834A (step S17). For example, the target control apparatus 70A may determine that the internal spaces have been filled with the purge gas in the case where the pressure P2 measured by the second pressure sensor 834A has become greater than or equal to a pre-set threshold Pa, and may determine that the internal spaces have not been filled with the purge gas in the case where the pressure P2 has not become greater than or equal to the threshold Pa. This threshold Pa may be a pressure that is higher than the atmospheric pressure.

In the case where the target control apparatus 70A has determined in step S17 that the first internal space 751A and the second internal space 781A are not filled with the purge gas, the process of step S17 may be carried out once again after a predetermined amount of time has elapsed.

On the other hand, in the case where the target control apparatus 70A has determined in step S17 that the first internal space 751A and the second internal space 781A are filled with the purge gas, the fourth valve V4 may be closed (step S18). After this, the target control apparatus 70A may close the first valve V1 (step S19).

As a result of the aforementioned processes, the chamber 2 can enter a state in which the interior of the chamber 2 is filled with the etchant gas, due to the closed second valve V2. In addition, the first pipe 75A can enter a state in which the first internal space 751A is filled with the purge gas, due to the closed first valve V1.

After this, the operator may remove the joint 84A and remove the target generator 72A from the chamber 2. At this time, the first valve V1 is closed, and thus the target generator 72A can be removed from the chamber 2 without the nozzle hole 724A of the nozzle 723A making contact with air. In addition, the second valve V2 is closed, and thus air can be suppressed from entering into the chamber 2. Furthermore, because the second valve V2 is closed, etchant gas remaining inside the chamber 2, solid pieces of the target material, and so on can be prevented from dispersing or scattering outside the chamber 2.

As described above, the target supply apparatus 7A may include the first pipe 75A that covers the nozzle 723A and the first valve V1 that covers the cover opening 752A of the first pipe 75A.

Even in the case where, for example, the target material adheres to the leading end of the nozzle 723A, the target material can be suppressed from scattering by the first valve V1 closing the cover opening 752A in this manner.

The target supply apparatus 7A may include the cylindrical first pipe 75A that extends from the tank 721A to the leading end of the nozzle 723A. In addition, the first pipe 75A may be provided so that the first internal space 751A is airtight when the first valve V1 closes the cover opening 752A.

Through this, the target generator 72A can be removed from the chamber 2 while suppressing the nozzle 723A from coming into contact with air.

As shown in FIGS. 2 and 3, the target supply apparatus 7A may include the second pipe 77A and the connection section 78A. The connection section 78A may be configured such that the second internal space 781A can be formed by the second pipe 77A, the fourth pipe 81A, the shield plate 762A of the first valve V1, and the shield plate 802A of the second valve V2. The connection section 78A may include the second exhaust section 82A that exhausts the second internal space 781A.

Through this, the second pipe 77A can be connected to the fourth pipe 81A with the cover opening 752A in a closed state when installing the target generator 72A in the chamber 2. The second exhaust section 82A can then exhaust air from the second internal space 781A. By the second valve V2 opening the chamber opening 20 and the first valve V1 opening the cover opening 752A after the air has been exhausted, the target material 270 can be supplied into the chamber 2.

Accordingly, the target generator 72A can be installed in the chamber 2 while suppressing the nozzle hole 724A from coming into contact with air.

The target supply apparatus 7A may include the purge gas supply section 83A that supplies the purge gas to the first internal space 751A and the second internal space 781A.

Through this, when the target generator 72A is removed from the chamber 2, the second exhaust section 82A can exhaust the etchant gas from the first internal space 751A and the second internal space 781A with the chamber opening 20 and the cover opening 752A in an open state. Then, the chamber opening 20 can be closed, and the purge gas supply section 83A can supply the purge gas to the first internal space 751A and the second internal space 781A. By then closing the cover opening 752A, the first internal space 751A can be made airtight while filled with the purge gas.

Accordingly, the target generator 72A can be removed from the chamber 2 while suppressing the nozzle hole 724A from coming into contact with air. In addition, because the first internal space 751A can be filled with the purge gas, the entry of air into the first internal space 751A can be suppressed owing to a pressure difference between the inside and outside of the first pipe 75A.

The target supply apparatus 7A may include the joint 84A that positions and anchors the second pipe 77A and the fourth pipe 81A to each other.

Through this, the second pipe 77A and the fourth pipe 81A can be suppressed from being connected to each other in a skewed manner. Accordingly, air can be suppressed from entering into the chamber 2. In addition, the nozzle hole 724A can be suppressed from coming into contact with air.

Note that in the case where the second pressure sensor 834A is not provided, the target control apparatus 70A may determine whether or not the exhausting of the second internal space 781A and the first internal space 751A is finished based on the length of time in steps S3 and S5 for which the third valve V3 and the first valve V1 are open and the second exhaust apparatus 822A has continued the exhausting operations. Furthermore, in the case where the second pressure sensor 834A is not provided, the target control apparatus 70A may determine whether or not the first internal space 751A and the second internal space 781A are filled with the purge gas based on the length of time for which the fourth valve V4 is open and the purge gas supply source 832A has continued the purge gas supply operations.

Furthermore, the joint 84A need not be a quick coupling. The joint 84A may be a joint through which the droplet 27 can pass, such as a VCR metal gasket seal manufactured by Swagelok.

The aforementioned configuration may be applied in the second through fourth embodiments described hereinafter.

2.2 Second Embodiment

2.2.1 Overview

According to a second embodiment of the present disclosure, the cover may be configured so as to be capable of extending/retracting in an axial direction of the nozzle, and the cover opening may be formed at a size that enables the nozzle to be passed into the cover opening.

According to this target supply apparatus, the target generator can be installed in the chamber by attaching the cover to the chamber. After this, the nozzle can be brought closer to a plasma generation site within the chamber while retracting the cover.

2.2.2 Configuration

FIG. 6A illustrates the overall configuration of a target supply apparatus according to the second embodiment, and illustrates a state in which the target supply apparatus is mounted.

Figure 6B:
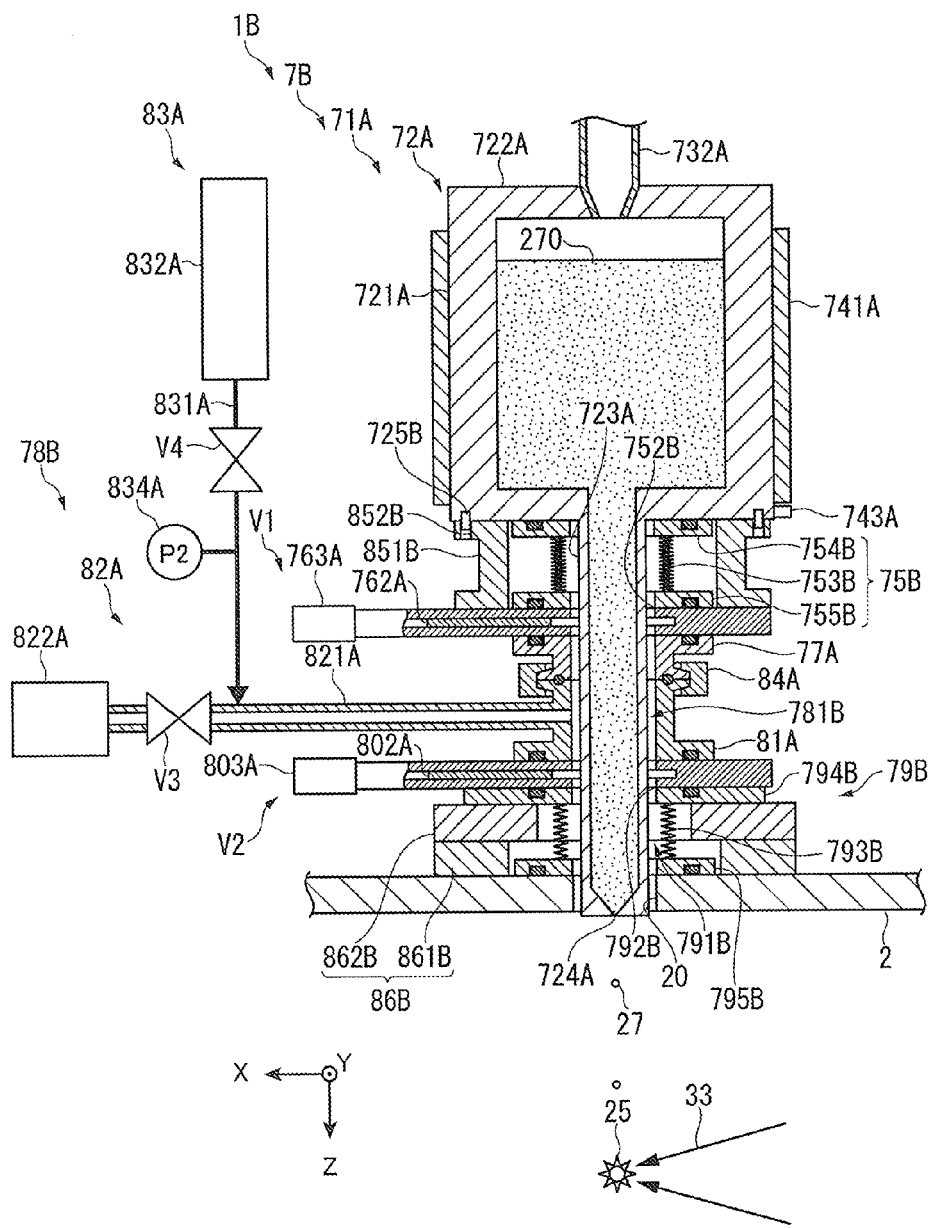
FIG. 6B illustrates the overall configuration of a target supply apparatus, and illustrates a state in which the target supply apparatus is operating.

FIG. 6B illustrates the overall configuration of the target supply apparatus, and illustrates a state in which the target supply apparatus is operating.

The configuration of an EUV light generation apparatus 1B according to the second embodiment may, as shown in FIG. 6A, be the same as that of the EUV light generation apparatus 1A of the first embodiment, with the exception of a target supply apparatus 7B.

The target supply apparatus 7B may include a target control apparatus (not shown), the target generation section 71A, a first pipe 75B serving as a cover, the first valve V1, a support section 85B, the second pipe 77A, and a connection section 78B. The support section 85B may serve as a cover. The first valve V1 may serve as a cover opening/closing section.

A plurality of positioning pins 725B may be provided in the tank 721A of the target generator 72A that partially configures the target generation section 71A. The plurality of positioning pins 725B may be provided so as to protrude from a first surface of the tank 721A, at equal intervals in the circumferential direction of the tank 721A.

The first pipe 75B may be provided so as to cover at least the nozzle 723A of the target generator 72A. The first pipe 75B may include a flexible pipe 753B, an anchoring portion 754B, and an anchoring portion 755B.

The flexible pipe 753B may be disposed along the axial direction of the nozzle 723A, so as to be capable of extending/retracting.

The anchoring portion 754B and the anchoring portion 755B may each be formed in a ring shape. The first anchoring portion 754B may be connected to a first end of the flexible pipe 753B. The anchoring portion 754B may be anchored to the first surface of the tank 721A so as to surround the nozzle 723A. Here, a seal may be formed between a first surface of the first pipe 75B and the first surface of the tank 721A by embedding the O-ring 758A in a groove provided in the anchoring portion 754B.

The second anchoring portion 755B may be connected to a second end of the flexible pipe 753B. The anchoring portion 755B may be anchored to the guide portion 761A of the first valve V1 so as to surround the nozzle 723A when the flexible pipe 753B is retracted. Here, a seal may be formed between a second surface of the first pipe 75B and a first surface of the first valve V1 by embedding the O-ring 759A in a groove provided in the anchoring portion 755B.

As a result of such a seal, a first internal space 751B in the first pipe 75B can be made airtight when a cover opening 752B of the first pipe 75B is closed by the first valve V1.

The support section 85B may include a first spacer 851B and a second spacer 853B. These spacers may serve as covers.

The spacer 851B and the spacer 853B may be disposed so as to cover the first pipe 75B. Of the spacer 851B and the spacer 853B, at least the spacer 853B may be formed in a cylindrical shape by combining a plurality of members. By configuring the spacer 853B of a plurality of members in such a manner, the spacer 853B can be made removable from the spacer 851B by dividing the plurality of members in, for example, the horizontal direction in FIG. 6A (an X direction) or a direction orthogonal to the depictions in the drawings (a Y direction), even when the nozzle 723A is passed into the first internal space 751B. Flanges that extend outward may be provided in both ends of both the spacer 851B and the spacer 853B.

A plurality of positioning holes 852B may be provided so as to pass through the flange on a first end of the spacer 851B. The number of positioning holes 852B may be the same as the number of the positioning pins 725B provided in the tank 721A. The spacer 851B may be disposed on and anchored to the first surface of the guide portion 761A in the first valve V1 so as to surround the first pipe 75B. A height dimension of the spacer 851B may, as shown in FIG. 6B, be a size at which the leading end of the nozzle 723A is positioned within the chamber 2 when the target generator 72A is placed upon the spacer 851B. The target generator 72A can be suppressed from rotating relative to the spacer 851B by fitting the positioning pins 725B into the positioning holes 852B when placing the target generator 72A on the spacer 851B.

Positioning holes 854B having the same shape as the positioning holes 852B may, as shown in FIG. 6A, be provided in the flange on a first end of the spacer 853B. Positioning pins 855B having the same shape as the positioning pins 725B may be provided in the flange on a second end of the spacer 853B. The spacer 853B may be configured so that the spacer 853B can be placed upon the spacer 851B so as to surround the first pipe 75B. The spacer 853B can be suppressed from rotating relative to the spacer 851B by fitting the positioning pins 855B into the positioning holes 852B when placing the spacer 853B on the spacer 851B. A height dimension of the spacer 853B may be a size at which the leading end of the nozzle 723A is positioned further in a −Z direction than the cover opening 752B on a second end of the first pipe 75B when the spacer 853B is placed upon the target generator 72A. The target generator 72A can be suppressed from rotating relative to the spacer 853B by fitting the positioning pins 725B into the positioning holes 854B when placing the target generator 72A on the spacer 853B.

The connection section 78B may include a third pipe 79B, the second valve V2, the fourth pipe 81A, the second exhaust section 82A, the purge gas supply section 83A, the joint 84A, and a position adjustment section 86B.

The third pipe 79B may have the same configuration as the first pipe 75B, and may include a flexible pipe 793B, an anchoring portion 794B, and an anchoring portion 795B.

The flexible pipe 793B may be disposed so that the nozzle 723A can be passed thereinto, and may be capable of deforming in the Z direction as well as in the X and Y directions.

The anchoring portion 794B may be connected to a first end of the flexible pipe 793B. The anchoring portion 794B may be disposed on and anchored to the second surface of the guide portion 801A in the second valve V2 so that the nozzle 723A can be passed thereinto. Here, a seal may be formed between a first surface of the third pipe 79B and the second valve V2 by embedding the O-ring 799A in a groove provided in the anchoring portion 794B.

The anchoring portion 795B may be connected to a second end of the flexible pipe 793B. The anchoring portion 795B may be disposed on and anchored to a first surface on the outside of the chamber 2 so that the nozzle 723A can be passed thereinto. Here, a seal may be formed between a second surface of the third pipe 79B and a first surface on the outside of the chamber 2 by embedding the O-ring 799A in a groove provided in the anchoring portion 795B.

As a result of such a seal, a third internal space 791B in the third pipe 79B and the interior of the chamber 2 can be made airtight when an opening 792B in a first end of the third pipe 79B is closed by the second valve V2.

The position adjustment section 86B may include a stage anchoring member 861B and an XY stage 862B.

The stage anchoring member 861B may be anchored to an outer circumferential side of the anchoring portion 795B, on the first surface on the outside of the chamber 2.

The XY stage 862B may be anchored to a first surface of the stage anchoring member 861B. The anchoring portion 794B of the third pipe 79B may be anchored to a first surface of the XY stage 862B. The XY stage 862B may be electrically connected to the target control apparatus (not shown). The XY stage 862B may move the anchoring portion 794B in at least one of an X axis direction and a Y axis direction, based on a signal sent from the target control apparatus.

Here, the target generator 72A can be anchored to a first surface of the anchoring portion 794B via the second valve V2, the fourth pipe 81A, the second pipe 77A, the first valve V1, and the first pipe 75B, which are disposed in that order. Accordingly, when the anchoring portion 794B moves in the X axis direction or the Y axis direction, the target generator 72A also moves in the same direction as the anchoring portion 794B. The output position of the droplet 27 (that is, the position of the nozzle hole 724A in an XY plane) can be adjusted through the movement of the target generator 72A.

2.2.3 Operation 2.2.3.1 Operations when Installing Target Generator in Chamber

In the following, descriptions of operations identical to those in the first embodiment will be omitted.

The second valve V2 may close the opening 792B of the third pipe 79B before the target generator 72A is installed in the chamber 2. In addition, at this time, the interior of the chamber 2 may be filled with the etchant gas.

Meanwhile, the first valve V1 may close the cover opening 752B of the first pipe 75B before the target generator 72A is installed in the chamber 2. The fourth valve V4 (see FIG. 2) may be open. The third valve V3 may be closed. At this time, the first internal space 751B may be filled with the purge gas.

The operator may use, for example, a lifter (not shown) to lift an installation unit configured by joining the second pipe 77A, the first valve V1, the spacer 851B, and the target generator 72A that has been placed upon a first surface of the spacer 851B via the spacer 853B, in that order. Operating the lifter, the operator may then place the flange 771A of the second pipe 77A of the installation unit on the flange 811A of the fourth pipe 81A, and then position and anchor the flange 771A of the second pipe 77A and the flange 811A of the fourth pipe 81A to each other using the joint 84A. A seal can be formed between the second pipe 77A and the fourth pipe 81A, and an airtight second internal space 781B can be formed, as a result of this anchoring. Because the aforementioned operations are carried out in air, air can be present in the second internal space 781B.

The EUV light generation control system of the EUV light generation apparatus may perform the processes illustrated in FIG. 4 based on operations performed by the operator.

Through the aforementioned processes, the target generator 72A can be installed in the chamber 2 with both the first internal space 751B and second internal space 781B being exhausted and without the nozzle hole 724A of the nozzle 723A making contact with air.

After this, the operator may extend the flexible pipe 753B while moving only the target generator 72A of the installation unit in the −Z direction using, for example, the lifter, and may remove the positioning pins 725B from the positioning holes 854B in the spacer 853B. The operator may then remove the spacer 853B from the spacer 851B. Thereafter, the operator may retract the flexible pipe 753B while moving the target generator 72A in the +Z direction using the lifter, and may fit the positioning pins 725B into the positioning holes 852B in the spacer 851B.

Through these processes, the leading end of the nozzle 723A can be positioned inside of the chamber 2, as shown in FIG. 6B.

The operator may then operate the EUV light generation apparatus and perform a trial run of EUV light generation. During this EUV light generation, the output position of the droplet 27 can shift, in the X axis direction or the Y axis direction, from the desired plasma generation site 25. In such a case, the operator may adjust the output position of the droplet 27 by operating the target control apparatus (not shown) and moving the anchoring portion 794B using the XY stage 862B. Then, based on a detection result from the target sensor 4 (see FIG. 1), the target control apparatus may repeatedly adjust the output position and perform trial runs of the EUV light generation until the output position of the droplet 27 has reached the correct position; and when the adjustment is complete, may continuously generate the EUV light.

2.2.3.2 Operations when Removing Target Generator from Chamber

The chamber 2, the first internal space 751B, the second internal space 781B, and the third internal space 791B in the third pipe 79B may be filled with the etchant gas before the target generator 72A is removed from the chamber 2.

After this, the operator may operate the EUV light generation apparatus for the purpose of removing the target generator 72A from the chamber 2.

The EUV light generation control system of the EUV light generation apparatus may perform the processes illustrated in FIG. 5 based on operations performed by the operator.

As a result of the aforementioned processes, the chamber 2 can enter a state in which the interior of the chamber 2 is filled with the etchant gas, due to the closed second valve V2. In addition, the first pipe 75B can enter a state in which the first internal space 751B is filled with the purge gas, due to the closed first valve V1.

After this, the operator may extend the flexible pipe 753B while moving only the target generator 72A in the −Z direction using the lifter, and may remove the positioning pins 725B from the positioning holes 852B in the spacer 851B. Once the target generator 72A has moved to a position where the spacer 853B can be installed between the target generator 72A and the spacer 851B, the operator may stop moving the target generator 72A. Then, the operator may dispose the spacer 853B between the target generator 72A and the spacer 851B and fit the positioning pins 855B into the positioning holes 852B in the spacer 851B. Thereafter, the operator may retract the flexible pipe 753B while moving the target generator 72A in the +Z direction using the lifter, and may fit the positioning pins 725B into the positioning holes 854B in the spacer 853B, as shown in FIG. 6A.

The operator may then remove the joint 84A and remove the installation unit, including the target generator 72A, from the chamber 2 using the lifter. At this time, the first valve V1 is closed, and thus the target generator 72A can be removed from the chamber 2 without the nozzle hole 724A of the nozzle 723A making contact with air. In addition, the second valve V2 is closed, and thus air can be suppressed from entering into the chamber 2.

As described above, the first pipe 75B may be installed so as to be capable of extending/retracting in the axial direction of the nozzle 723A. In addition, the cover opening 752B may be formed at a size that enables the nozzle 723A to be passed thereinto.

Through this, the nozzle 723A can be brought closer to the plasma generation site 25 while retracting the first pipe 75B, in a state in which the target generator 72A is installed in the chamber 2.

The target supply apparatus 7B may include the position adjustment section 86B that moves the target generator 72A in the X axis direction or the Y axis direction.

Through this, the output position of the droplet 27 can be correctly adjusted immediately after the target generator 72A has been installed. In addition, the output position of the droplet 27 can be correctly adjusted even in the case where the output position has drifted due to heat.

In addition, the flexible pipe 793B may be configured to be deformable.

Through this, a load placed on the flexible pipe 793B can be suppressed even in the case where the anchoring portion 794B has moved in the X axis direction or the Y axis direction.

2.3 Third Embodiment

2.3.1 Overview

According to a third embodiment of the present disclosure, a target generator, a cover having a cover opening, and a cover opening/closing section that opens/closes the cover opening may be provided in a target supply apparatus of an EUV light generation apparatus configured to generate droplets through electrostatic extraction.

According to this configuration, when the target generator is removed from the chamber, the target material can be suppressed from scattering by the cover opening/closing section closing the cover opening, even in the case where the target material adheres to the leading end of the nozzle.

2.3.2 Configuration

Figure 7:
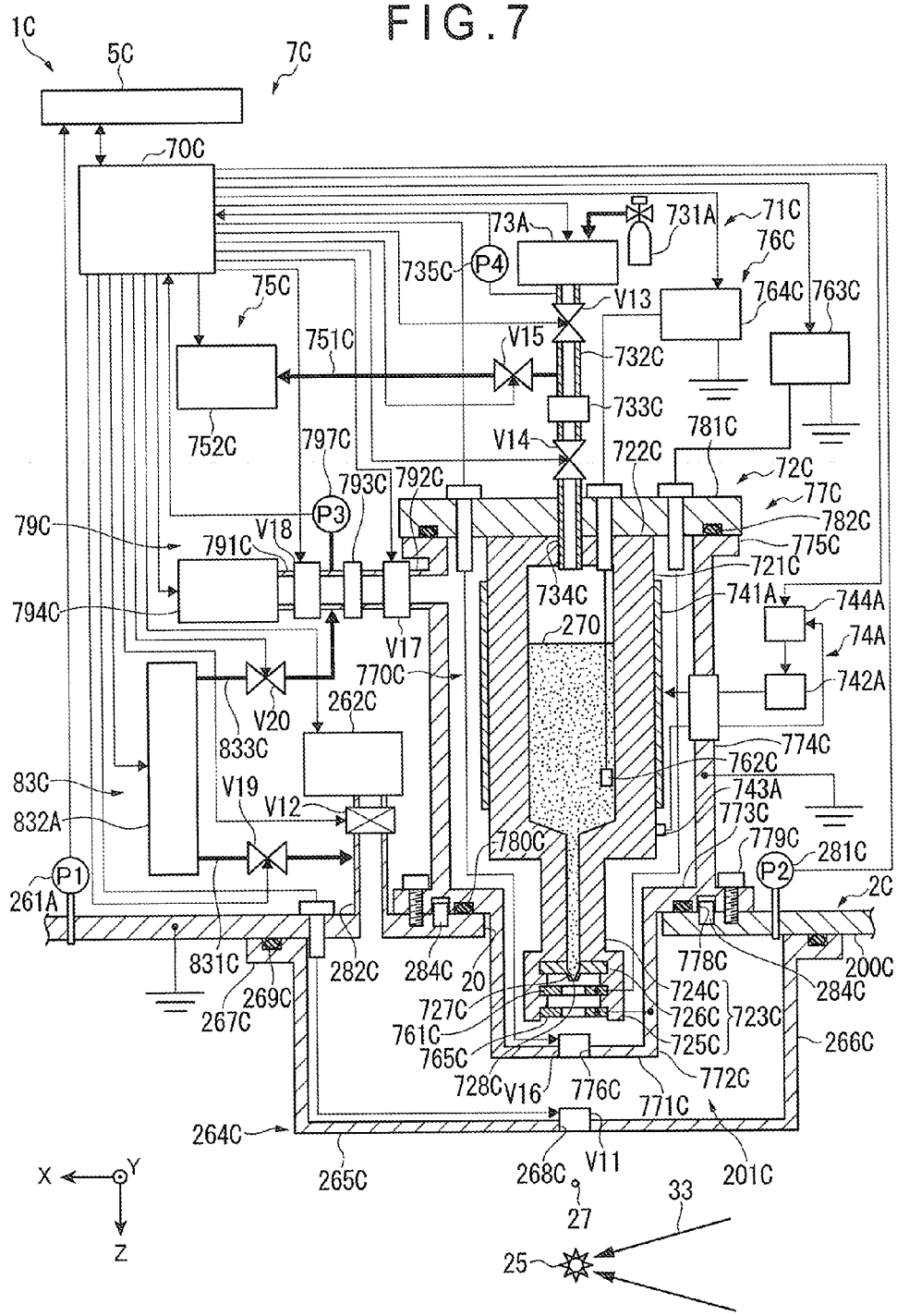
FIG. 7 illustrates the overall configuration of an EUV light generation apparatus that includes a target supply apparatus according to a third embodiment.

FIG. 7 illustrates the overall configuration of an EUV light generation apparatus that includes the target supply apparatus according to the third embodiment.

As shown in FIG. 7, an EUV light generation apparatus 1C according to the third embodiment may have the same configuration as the EUV light generation apparatus 1A according to the first embodiment, with the exception of the configurations of a chamber 2C, an EUV light generation control system 5C, and a target supply apparatus 7C.

The chamber 2C may include a box-shaped chamber main body 200C. The chamber main body 200C may be provided with the first pressure sensor 261A, the first exhaust apparatus 262A (see FIG. 2), a second exhaust apparatus 262C, a first cover 264C, a first valve V11 serving as a chamber opening/closing section, a second pressure sensor 281C, and an etchant gas supply section (not shown).

The first cover 264C may have a plate-shaped base surface portion 265C, a cylindrical side surface portion 266C, and a flange portion 267C on the outer circumference of the side surface portion 266C. An opening 268C may be provided in approximately the center of the base surface portion 265C. The opening 268C may be of a size that allows the droplet 27 to pass therethrough.

The first cover 264C may be anchored to an inner wall surface of the chamber main body 200C so as to cover a chamber opening 20 of the chamber main body 200C and so that the center of the opening 268C and the center of the chamber opening 20 match. Here, a seal may be formed between a first surface of the flange portion 267C and the inner wall surface of the chamber main body 200C by embedding an O-ring 269C in a groove provided in the flange portion 267C.

The first valve V11 may be disposed so as to be capable of opening/closing the opening 268C of the first cover 264C. The first valve V11 may be one of a gate valve, a ball valve, a butterfly valve, and the like. The first valve V11 may be electrically connected to a target control apparatus 70C, which will be mentioned later. The first valve V11 may switch the opening 268C between open and closed states based on a signal sent from the target control apparatus 70C. By the first valve V11 closing the opening 268C in this manner, a first internal space 201C that is defined by the first cover 264C and the chamber main body 200C can be formed.

The second pressure sensor 281C may be provided in the chamber main body 200C so as to measure a pressure within the first internal space 201C. The second pressure sensor 281C may be electrically connected to the target control apparatus 70C. The second pressure sensor 281C may send a signal corresponding to the pressure in the first internal space 201C to the target control apparatus 70C.

The second exhaust apparatus 262C may be connected to the chamber main body 200C via a pipe 282C. A second valve V12 may be provided in the pipe 282C. The second valve V12 may be one of a gate valve, a ball valve, a butterfly valve, and the like. The second valve V12 may be electrically connected to the target control apparatus 70C. The second valve V12 may switch between open and closed states based on a signal sent from the target control apparatus 70C.

The target supply apparatus 7C may include the target control apparatus 70C, a target generation section 71C, a cover 77C, a fourth exhaust section 79C, and a purge gas supply section 83C.

The target generation section 71C may include a target generator 72C, the pressure adjuster 73A, the temperature adjustment unit 74A, a third exhaust section 75C, and an electrostatic extraction unit 76C.

The target generator 72C may include a tank 721C. A nozzle 723C may be provided in the tank 721C.

The nozzle 723C may include a nozzle main body 724C, a leading end holding portion 725C, and an output portion 726C. The nozzle main body 724C may be disposed so as to protrude into the chamber 2C from a first surface of the tank 721C. The leading end holding portion 725C may be provided on the leading end of the nozzle main body 724C. The leading end holding portion 725C may be formed as a cylinder whose diameter is greater than that of the nozzle main body 724C. The leading end holding portion 725C may be configured as a separate entity from the nozzle main body 724C and may be anchored to the nozzle main body 724C.

The output portion 726C may be formed as an approximately circular plate. The output portion 726C may be held by the leading end holding portion 725C so as to make tight contact with the leading end surface of the nozzle main body 724C. A circular cone-shaped protruding portion 727C may be provided in a central area of the output portion 726C. The output portion 726C may be held so that the protruding portion 727C protrudes into the chamber 2C. A nozzle hole 728C may be provided in the approximate center of the protruding portion 727C. It is preferable for the output portion 726C to be configured of a material that has a lower wettability to the target material 270. In the case where the output portion 726C is not configured of a material that has a lower wettability to the target material 270, at least the surface of the output portion 726C may be coated with the material that has a lower wettability to the target material 270.

The tank 721C, the nozzle 723C, and the output portion 726C may be configured of electrically insulated materials. In the case where these elements are configured of materials that are not electrically insulated materials, for example, metal materials such as molybdenum, an electrically insulated material may be disposed between the chamber 2C and the target generator 72C, between the output portion 726C and an extraction electrode 761C (mentioned later), and so on.

The pressure adjuster 73A may be connected to a first end portion 722C of the tank 721C via a pipe 732C, a joint 733C, and a pipe 734C. A first end of the pipe 732C may be connected to the pressure adjuster 73A. The pipe 734C may be connected to the first end portion 722C so that the first end of the pipe 734C is located within the tank 721C. The joint 733C may connect a second end of the pipe 732C to a second end of the pipe 734C in a disconnectable state. The pressure adjuster 73A can adjust a pressure within the target generator 72C as a result of the joint 733C connecting the pipe 732C and the pipe 734C in this manner.

A third valve V13 may be provided in the pipe 732C. A fourth valve V14 may be provided in the pipe 734C. The third valve V13 and the fourth valve V14 may each be one of a gate valve, a ball valve, a butterfly valve, and the like. The third valve V13 and the fourth valve V14 may be electrically connected to the target control apparatus 70C. The third valve V13 and the fourth valve V14 may switch between open and closed states based on a signal sent from the target control apparatus 70C. A fourth pressure sensor 735C may be provided in the pipe 732C. The fourth pressure sensor 735C may be electrically connected to the target control apparatus 70C and may send a signal corresponding to the pressure in the pipe 732C to the target control apparatus 70C.

The third exhaust section 75C may include a pipe 751C, a third exhaust apparatus 752C, and a fifth valve V15. A first end of the pipe 751C may be connected to the pipe 732C between the third valve V13 and the joint 733C. The third exhaust apparatus 752C may be connected to a second end of the pipe 751C. The third exhaust apparatus 752C may be electrically connected to the target control apparatus 70C. The third exhaust apparatus 752C may exhaust the interior of the pipe 732C based on a signal sent from the target control apparatus 70C. The fifth valve V15 may be provided in the pipe 751C. The fifth valve V15 may be electrically connected to the target control apparatus 70C and may switch between open and closed states based on a signal sent from the target control apparatus 70C.

The electrostatic extraction unit 76C may include a first electrode 761C, a second electrode 762C, a pulse voltage generator 763C, a high voltage power source 764C, and a third electrode 765C. As will be described later, the droplet 27 may be extracted from the output portion 726C using a potential difference arising between the first electrode 761C and the second electrode 762C. The third electrode 765C may accelerate the extracted droplet using the fact that the droplet is charged.

The high voltage power source 764C may be electrically connected to the second electrode 762C.

The third electrode 765C may be configured in essentially the same approximate plate shape as the first electrode 761C. A through-hole having essentially the same circular shape as a through-hole in the first electrode 761C may be formed in the third electrode 765C. The third electrode 765C may be held by the leading end holding portion 725C on the opposite side to the output portion 726C so as not to make contact with the first electrode 761C. It is preferable for the third electrode 765C to be held so that the center axis of the through-hole in the third electrode 765C essentially matches the center axis of the through-hole in the first electrode 761C and the axis of rotational symmetry of the circular cone-shaped protruding portion 727C. Through this configuration, an electrical field is easily concentrated at the protruding portion 727C, and thus it can be easy to extract the droplet 27 from the output portion 726C. The pulse voltage generator 763C may be electrically connected to the first electrode 761C. The third electrode 765C may be grounded via the cover 77C.

The target control apparatus 70C may be electrically connected to the pulse voltage generator 763C and the high voltage power source 764C.

The cover 77C may be configured to cover the entirety of the target generator 72C. The cover 77C may include a plate-shaped base surface portion 771C whose surface area is lower than the area of the chamber opening 20, a cylindrical first side surface portion 772C, an intermediate portion 773C that extends outward from the first side surface portion 772C, a cylindrical second side surface portion 774C positioned further inward than an end of the intermediate portion 773C, and a flange portion 775C that extends outward from the second side surface portion 774C.

A cover opening 776C may be provided in approximately the center of the base surface portion 771C. The size of the cover opening 776C may be a size that allows the droplet 27 to pass therethrough. Here, it is preferable for the cover opening 776C to be provided so that the center axis of the cover opening 776C and the center axis of the opening 268C match.

A sixth valve V16 may be provided in the cover opening 776C of the base surface portion 771C. The sixth valve V16 may serve as a cover opening/closing section. The sixth valve V16 may be a gate valve, a ball valve, a butterfly valve, or the like. The sixth valve V16 may be electrically connected to the target control apparatus 70C and may switch between open and closed states based on a signal sent from the target control apparatus 70C. In this manner, the cover 77C can be made airtight by the sixth valve V16 closing the cover opening 776C.

A plurality of positioning holes 778C may be provided in a first surface of the intermediate portion 773C. The plurality of positioning holes 778C may be disposed along the circumferential direction of the intermediate portion 773C. The positioning holes 778C may fit with corresponding positioning pins 284C provided in an outer wall surface of the chamber main body 200C. The cover 77C can be positioned relative to the chamber main body 200C in the XY directions by fitting the positioning holes 778C with the positioning pins 284C in this manner.

Meanwhile, bolts 779C may be passed through areas that protrude further outward than the second side surface portion 774C. By screwing the bolts 779C into the chamber main body 200C, the cover 77C can be anchored to the chamber main body 200C in a state in which the first side surface portion 772C is passed into the chamber opening 20 and the base surface portion 771C is in a position that is separated from the base surface portion 265C in the Z direction. Here, a seal may be formed between the first surface of the intermediate portion 773C and the outer wall surface of the chamber main body 200C by embedding an O-ring 780C in a groove provided in the intermediate portion 773C.

The second side surface portion 774C may be grounded.

A cap portion 781C that shuts an opening of the second side surface portion 774C may be provided in a first surface of the flange portion 775C. Here, a seal may be formed between a first surface of the cap portion 781C and the first surface of the flange portion 775C by embedding an O-ring 782C in a groove provided in the cap portion 781C. The tank 721C may be anchored to the first surface of the cap portion 781C.

Meanwhile, the pipe 734C may be passed through the cap portion 781C and the first end portion 722C so that a leading end of the pipe 734C is positioned within the tank 721C.

The fourth exhaust section 79C may include a pipe 791C, a pipe 792C, a joint 793C, a fourth exhaust apparatus 794C, a seventh valve V17, an eighth valve V18, and a third pressure sensor 797C.

A first end of the pipe 791C may be connected to the fourth exhaust apparatus 794C. A second end of the pipe 792C may be connected to the second side surface portion 774C of the cover 77C. The joint 793C may connect a second end of the pipe 791C to a first end of the pipe 792C in a disconnectable state. By connecting the pipe 791C and the pipe 792C using the joint 793C in this manner, the fourth exhaust apparatus 794C can exhaust a second internal space 770C in the cover 77C.

The fourth exhaust apparatus 794C may be electrically connected to the target control apparatus 70C. The fourth exhaust apparatus 794C may exhaust the second internal space 770C based on a signal sent from the target control apparatus 70C.

The seventh valve V17 and the eighth valve V18 may be provided in the pipe 792C and the pipe 791C, respectively. The seventh valve V17 and the eighth valve V18 may be electrically connected to the target control apparatus 70C and may switch between open and closed states based on a signal sent from the target control apparatus 70C.

The third pressure sensor 797C may be provided in a location of the pipe 791C that is closer to the pipe 792C than the eighth valve V18 so as to be capable of measuring a pressure in the cover 77C. The third pressure sensor 797C may be electrically connected to the target control apparatus 70C. The third pressure sensor 797C may send a signal corresponding to the pressure in the cover 77C to the target control apparatus 70C.

The purge gas supply section 83C may supply a purge gas to the first internal space 201C in the chamber 2C and the second internal space 770C in the cover 77C. The purge gas supply section 83C may include a pipe 831C, the purge gas supply source 832A, a pipe 833C, a ninth valve V19, and a tenth valve V20.

A second end of the pipe 831C may be connected to the pipe 282C at a location that is closer to the first internal space 201C than the second valve V12. A second end of the pipe 833C may be connected to the pipe 791C at a location that is closer to the pipe 792C than the eighth valve V18.

The ninth valve V19 and the tenth valve V20 may be provided in the pipe 831C and the pipe 833C, respectively, and may be electrically connected to the target control apparatus 70C. The ninth valve V19 and the tenth valve V20 may switch between open and closed states based on a signal sent from the target control apparatus 70C.

2.3.3 Operation 2.3.3.1 Operations when Installing Target Generator in Chamber

Figure 8:
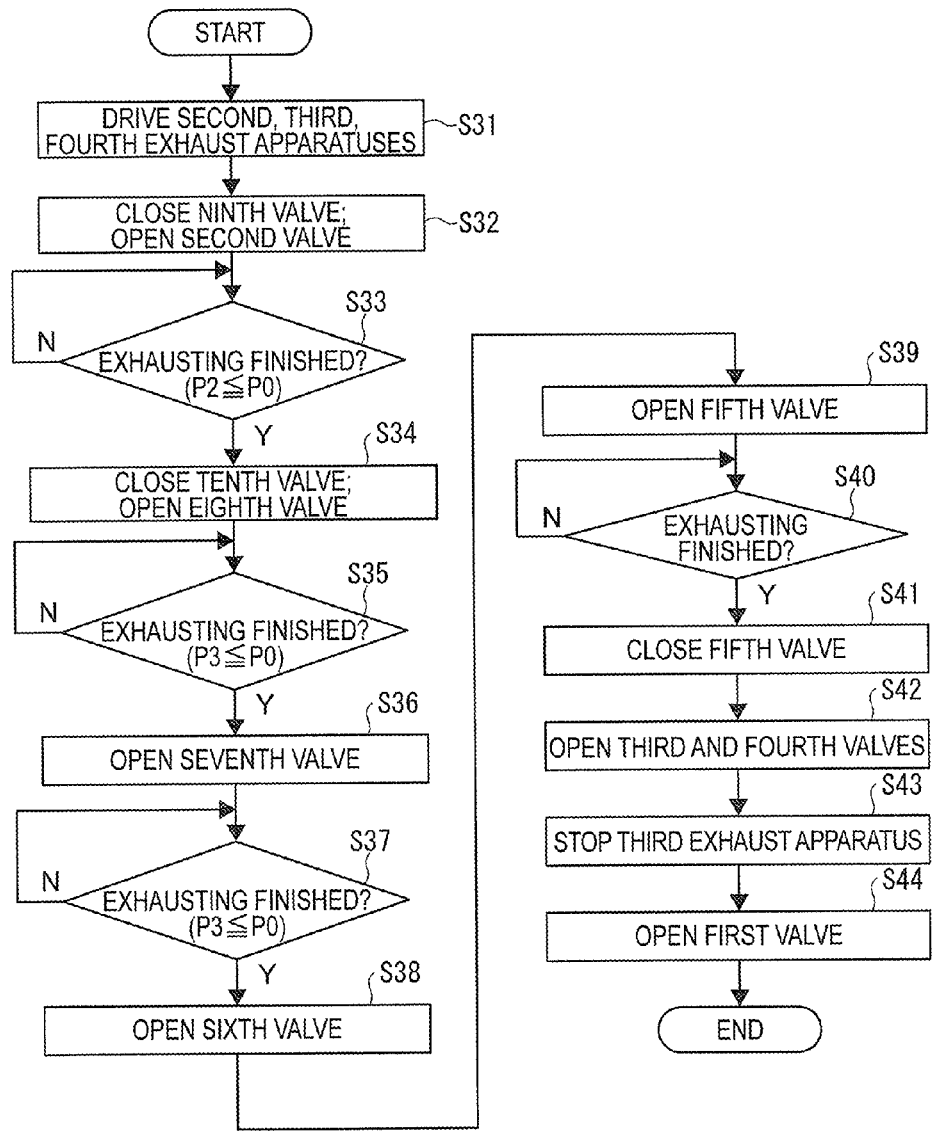
FIG. 8 is a flowchart illustrating operations performed when a target generator is installed in a chamber.

FIG. 8 is a flowchart illustrating operations performed when the target generator is installed in the chamber.

The first valve V11 through the eighth valve V18 may be closed and the ninth valve V19 and the tenth valve V20 may be open before the target generator 72C is installed in the chamber 2C. At this time, the interior of the chamber 2C may be filled with the etchant gas. Air may be present in the first internal space 201C. Furthermore, the second internal space 770C may be filled with the purge gas.

With the target generator 72C anchored so that the leading end of the nozzle 723C is positioned within the second internal space 770C, the operator may anchor the cover 77C to the chamber 2C. At this time, the positioning pins 284C may be fitted into the positioning holes 778C and the cover 77C may be anchored to the chamber 2C using the bolts 779C. The first internal space 201C can be made airtight as a result of this anchoring.

Meanwhile, the pressure adjuster 73A may be made capable of exhausting the target generator 72C by connecting the pipe 732C and the pipe 734C using the joint 733C. Furthermore, the second internal space 770C may be put into an exhaustible state by connecting the pipe 791C and the pipe 792C using the joint 793C.

Upon receiving a signal from the EUV light generation control system 5C, the target control apparatus 70C may drive the second exhaust apparatus 262C, the third exhaust apparatus 752C, and the fourth exhaust apparatus 794C, as shown in FIG. 8 (step S31). After this, the target control apparatus 70C may close the ninth valve V19 and open the second valve V12 (step S32). The air present in the first internal space 201C can be exhausted as a result of the processes of steps S31 and S32. The second pressure sensor 281C may then send a signal corresponding to the pressure P2 in the first internal space 201C to the target control apparatus 70C.

The target control apparatus 70C may determine whether or not the exhausting of the first internal space 201C has finished based on a signal sent from the second pressure sensor 281C (step S33).

In the case where the target control apparatus 70C has determined in step S33 that the exhausting of the first internal space 201C is not finished, the process of step S33 may be carried out once again after a predetermined amount of time has elapsed. For example, in the case where the pressure P2 measured by the second pressure sensor 281C has dropped to or below the pre-set threshold P0, the target control apparatus 70C may determine that the exhausting has finished, whereas in the case where the pressure P2 is not at or below the threshold P0, the target control apparatus 70C may determine that the exhausting has not finished.

On the other hand, in the case where the target control apparatus 70C has determined in step S33 that the exhausting of the first internal space 201C has finished, the tenth valve V20 may be closed and the eighth valve V18 may be opened (step S34). By closing the tenth valve V20 and opening the eighth valve V18 after the exhausting of the first internal space 201C has finished in this manner, the pipe 791C and the area of the pipe 792C from the seventh valve V17 toward the fourth exhaust apparatus 794C can be exhausted. The third pressure sensor 797C may then send a signal corresponding to a pressure P3 in the pipe 791C and the pipe 792C to the target control apparatus 70C.

The target control apparatus 70C may determine whether or not the exhausting of the pipe 791C and the pipe 792C has finished based on a signal sent from the third pressure sensor 797C (step S35). The determination as to whether or not the exhausting has finished may, as in step S33, be carried out by comparing the pre-set threshold P0 and the measured pressure P3.

In the case where the target control apparatus 70C has determined in step S35 that the exhausting of the pipe 791C and the pipe 792C is not finished, the process of step S35 may be carried out once again after a predetermined amount of time has elapsed.

On the other hand, in the case where the target control apparatus 70C has determined in step S35 that the exhausting has finished, the seventh valve V17 may be opened (step S36). The second internal space 770C can be exhausted by opening the seventh valve V17 after the exhausting of the pipe 791C and the pipe 792C has finished in this manner. The third pressure sensor 797C may then send a signal corresponding to the pressure P3 in the second internal space 770C to the target control apparatus 70C.

The target control apparatus 70C may determine whether or not the exhausting of the second internal space 770C has finished based on a signal sent from the third pressure sensor 797C (step S37). The determination as to whether or not the exhausting has finished may, as in step S33, be carried out by comparing the pre-set threshold P0 and the measured pressure P3.

In the case where the target control apparatus 70C has determined in step S37 that the exhausting is not finished, the process of step S37 may be carried out once again after a predetermined amount of time has elapsed. On the other hand, in the case where the target control apparatus 70C has determined in step S37 that the exhausting has finished, the sixth valve V16 may be opened (step S38).

Next, the target control apparatus 70C may open the fifth valve V15 (step S39). The pipe 732C and the area of the pipe 734C from the fourth valve V14 toward the joint 733C can be exhausted by opening the fifth valve V15 in this manner. The fourth pressure sensor 735C may then send a signal corresponding to a pressure in the pipe 732C and the pipe 734C to the target control apparatus 70C.

The target control apparatus 70C may determine whether or not the exhausting of the pipe 732C and the pipe 734C has finished based on a signal sent from the fourth pressure sensor 735C (step S40).

In the case where the target control apparatus 70C has determined in step S40 that the exhausting is not finished, the process of step S40 may be carried out once again after a predetermined amount of time has elapsed, whereas in the case where it has been determined that the exhausting is finished, the fifth valve V15 may be closed (step S41).

Furthermore, the target control apparatus 70C may open the third valve V13 and the fourth valve V14 (step S42). The target control apparatus 70C may also stop the third exhaust apparatus 752C (step S43). Further still, the target control apparatus 70C may open the first valve V11 (step S44).

Through the aforementioned processes, the first valve V11 through the fourth valve V14 and the sixth valve V16 through the eighth valve V18 can be opened and the fifth valve V15, the ninth valve V19, and the tenth valve V20 can be closed. In addition, the second exhaust apparatus 262C and the fourth exhaust apparatus 794C can be driven, and the third exhaust apparatus 752C can enter a stopped state. The pressure in the target generator 72C can then be adjustable by the pressure adjuster 73A. In addition, the interior of the chamber main body 200C, the first internal space 201C, and the second internal space 770C can be exhausted by the second exhaust apparatus 262C and the fourth exhaust apparatus 794C. The target generator 72C can be installed in the chamber 2C without the nozzle hole 728C of the nozzle 723C making contact with air.

The EUV light generation apparatus 1C can generate the EUV light 251 by performing a process for outputting the droplet 27 into the chamber 2C and so on after the aforementioned operations have ended.

For example, the temperature adjustment unit 74A may heat the target material 270 in the target generator 72C to a predetermined temperature that is greater than or equal to the melting point of the target material 270. The high voltage power source 764C may apply a positive high voltage (for example, 20 kV) to the target material 270 in the tank 721C. Then, with the high voltage applied to the target material 270, the pulse voltage generator 763C may reduce the voltage applied to the extraction electrode 761C from the high voltage to a low voltage (for example, 15 kV); the low voltage may be held for a predetermined amount of time and then returned to the high voltage once again. At this time, the target material 270 can be extracted as the droplet 27 using static electricity in synchronization with the timing at which the voltage at the extraction electrode 761C drops. The droplet 27 can be given a positive charge. The droplet 27 can be accelerated by a grounded acceleration electrode 765C, can pass through a through-hole in the acceleration electrode 765C, and can then pass through the opening 268C. The droplet 27 that has passed through the opening 268C can be irradiated by the pulse laser beam 33 upon reaching the plasma generation site 25.

2.3.3.2 Operations when Removing Target Generator from Chamber

Figure 9:
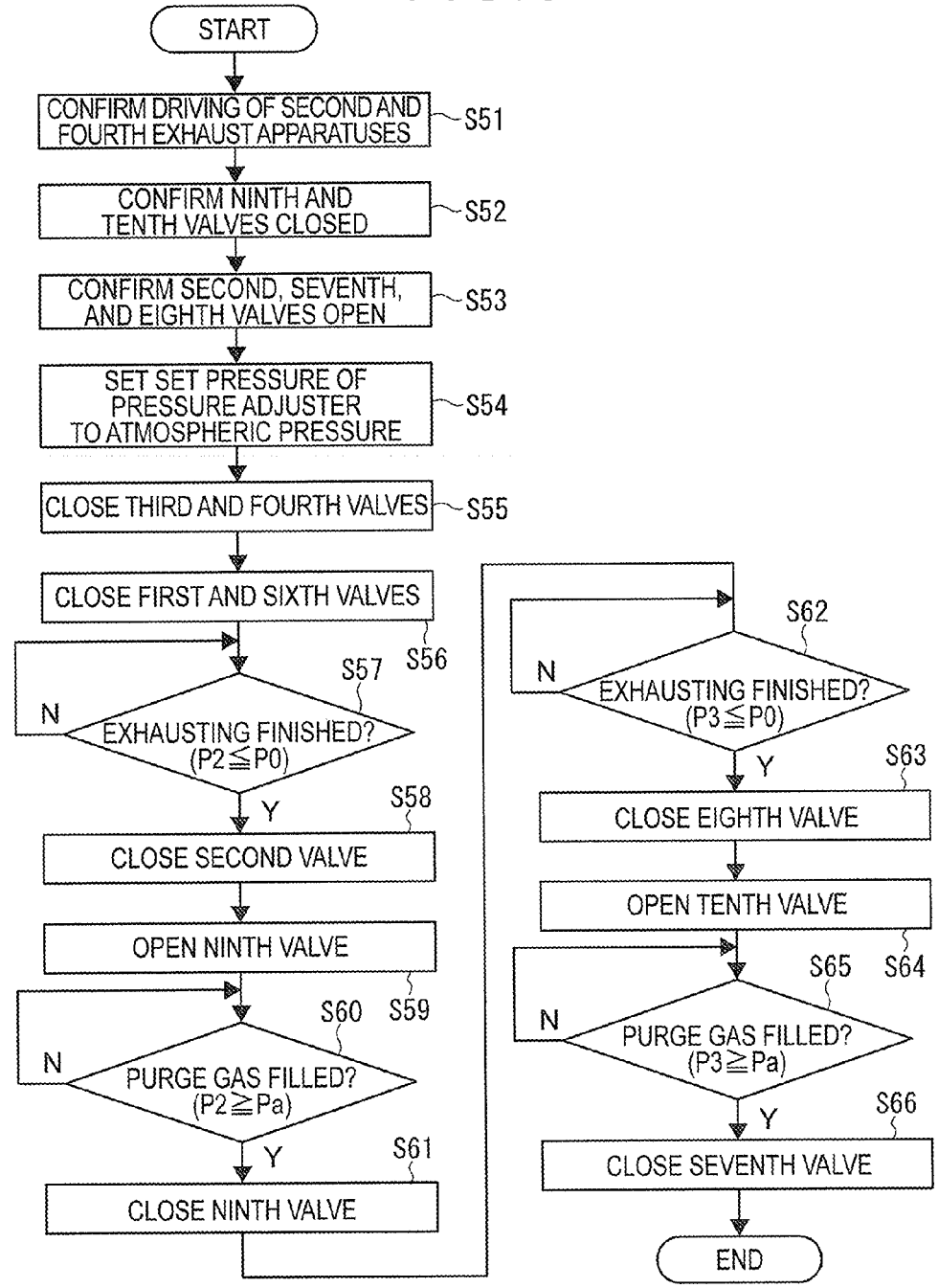
FIG. 9 is a flowchart illustrating operations performed when a target generator is removed from a chamber.

FIG. 9 is a flowchart illustrating operations performed when the target generator is removed from the chamber.

The chamber 2C, the first internal space 201C, and the second internal space 770C may be filled with the etchant gas before the target generator 72C is removed from the chamber 2C.

Upon receiving a signal from the EUV light generation control system 5C, the target control apparatus 70C may confirm whether or not the second exhaust apparatus 262C and the fourth exhaust apparatus 794C are being driven, as shown in FIG. 9 (step S51). Here, in the case where at least one of the second exhaust apparatus 262C and the fourth exhaust apparatus 794C are stopped, those stopped apparatuses may be driven.

After this, the target control apparatus 70C may confirm whether or not the ninth valve V19 and the tenth valve V20 are closed (step S52). Here, in the case where at least one of the ninth valve V19 and the tenth valve V20 is open, those open valves may be closed.

Furthermore, the target control apparatus 70C may confirm that the second valve V12, the seventh valve V17, and the eighth valve V18 are open (step S53). Here, in the case where at least one of the second valve V12, the seventh valve V17, and the eighth valve V18 are closed, those closed valves may be opened.

After this, the target control apparatus 70C may set a set pressure in the pressure adjuster 73A to the atmospheric pressure (step S54). By setting the pressure in this manner, the pressure of the inert gas within the pipe 732C, the pipe 734C, and the target generator 72C can be set to the atmospheric pressure.

Next, the target control apparatus 70C may close the third valve V13 and the fourth valve V14 (step S55). The target generator 72C can be made airtight as a result of the process of step S55.

In addition, the target control apparatus 70C may close the first valve V11 and the sixth valve V16 (step S56). The interior of the chamber 2C and the first internal space 201C can be blocked off from each other as a result of the process of step S56. In addition, the first internal space 201C and the second internal space 770C can be blocked off from each other.

After this, the target control apparatus 70C may determine whether or not the second exhaust apparatus 262C has finished exhausting the first internal space 201C based on a signal from the second pressure sensor 281C that corresponds to the pressure P2 in the first internal space 201C (step S57). In the case where the target control apparatus 70C has determined in step S57 that the exhausting is not finished, the process of step S57 may be carried out once again after a predetermined amount of time has elapsed. On the other hand, in the case where the target control apparatus 70C has determined in step S57 that the exhausting has finished, the second valve V12 may be closed (step S58). The first internal space 201C can be made airtight as a result of the process of step S58. The determination as to whether or not the exhausting is finished may be the same as the determination in the flow shown in FIG. 8.

The target control apparatus 70C may open the ninth valve V19 (step S59). The first internal space 201C can be filled with the purge gas from the purge gas supply source 832A as a result of the process of step S59.

The target control apparatus 70C may determine whether or not the first internal space 201C has been filled with the purge gas based on a signal from the second pressure sensor 281C that corresponds to the pressure P2 in the first internal space 201C (step S60). In the case where the target control apparatus 70C has determined in step S60 that the filling of the purge gas has not finished, the process of step S60 may be carried out once again after a predetermined amount of time has elapsed. On the other hand, in the case where the target control apparatus 70C has determined in step S60 that the filling of the purge gas has finished, the ninth valve V19 may be closed (step S61). The determination as to whether or not the filling is finished may be the same as the determination in the flow shown in FIG. 5.

The target control apparatus 70C may determine whether or not the exhausting of the second internal space 770C is finished based on a signal from the third pressure sensor 797C that corresponds to the pressure P3 in the second internal space 770C (step S62). In the case where the target control apparatus 70C has determined in step S62 that the exhausting is not finished, the process of step S62 may be carried out once again after a predetermined amount of time has elapsed. On the other hand, in the case where the target control apparatus 70C has determined in step S62 that the exhausting has finished, the eighth valve V18 may be closed (step S63). The determination as to whether or not the exhausting is finished may be the same as the determination in step S57.

The target control apparatus 70C may open the tenth valve V20 (step S64). The second internal space 770C can be filled with the purge gas from the purge gas supply source 832A as a result of the process of step S64.

The target control apparatus 70C may determine whether or not the second internal space 770C has been filled with the purge gas based on a signal from the third pressure sensor 797C that corresponds to the pressure P3 in the second internal space 770C (step S65). In the case where the target control apparatus 70C has determined in step S65 that the filling of the purge gas has not finished, the process of step S65 may be carried out once again after a predetermined amount of time has elapsed. On the other hand, in the case where the target control apparatus 70C has determined in step S65 that the filling of the purge gas has finished, the seventh valve V17 may be closed (step S66). The determination as to whether or not the filling is finished may be the same as the determination in step S60.

As a result of the aforementioned processes, the chamber 2C can enter a state in which the interior of the chamber 2C is filled with the etchant gas, due to the closed first valve V11. In addition, the first internal space 201C and the second internal space 770C can enter a state in which the spaces are filled with the purge gas, due to the closed first valve V11 and sixth valve V16.

With the target generator 72C anchored within the second internal space 770C, the operator may remove the cover 77C from the chamber 2C. The joint 733C and the pipe 792C may also be removed. At this time, the sixth valve V16 is closed, and thus the target generator 72C can be removed from the chamber 2C without the nozzle hole 728C of the nozzle 723C making contact with air. In addition, the first valve V11 is closed, and thus air can be suppressed from entering into the chamber 2C. Furthermore, because the first valve V11 is closed, etchant gas remaining inside the chamber 2C, solid pieces of the target material, and so on can be prevented from dispersing or scattering outside of the chamber 2C.

As described above, the cover 77C that covers the entirety of the target generator 72C and the sixth valve V16 that opens/closes the cover opening 776C of the cover 77C may be provided in the electrostatic extraction-type EUV light generation apparatus 1C.

According to the aforementioned configuration, the target material can be prevented from scattering by the sixth valve V16 closing the cover opening 776C when the target generator 72C is removed from the chamber 2C.

2.4 Fourth Embodiment

2.4.1 Overview

According to a fourth embodiment of the present disclosure, a target generator may include a tank, a nozzle, a cap portion that shuts an end area of the nozzle on the opposite side to a nozzle hole, and a pipe that is connected to the tank and the cap portion so that the interior of the tank and the interior of the nozzle communicate. A cover may be formed as a cylinder extending from the cap portion to a leading end of the nozzle. The cover may be provided so that an internal space surrounded by the cover, the cover opening/closing section, and the cap portion is made airtight by the cover opening/closing section closing the cover opening.

According to the aforementioned target supply apparatus, the internal space surrounded by the cover, the cover opening/closing section, and the cap portion can be made airtight by closing the cover opening after the target material has been supplied. Accordingly, the target generator can be removed from the chamber while suppressing the nozzle hole from coming into contact with air.

2.4.2 Configuration

Figure 10A:
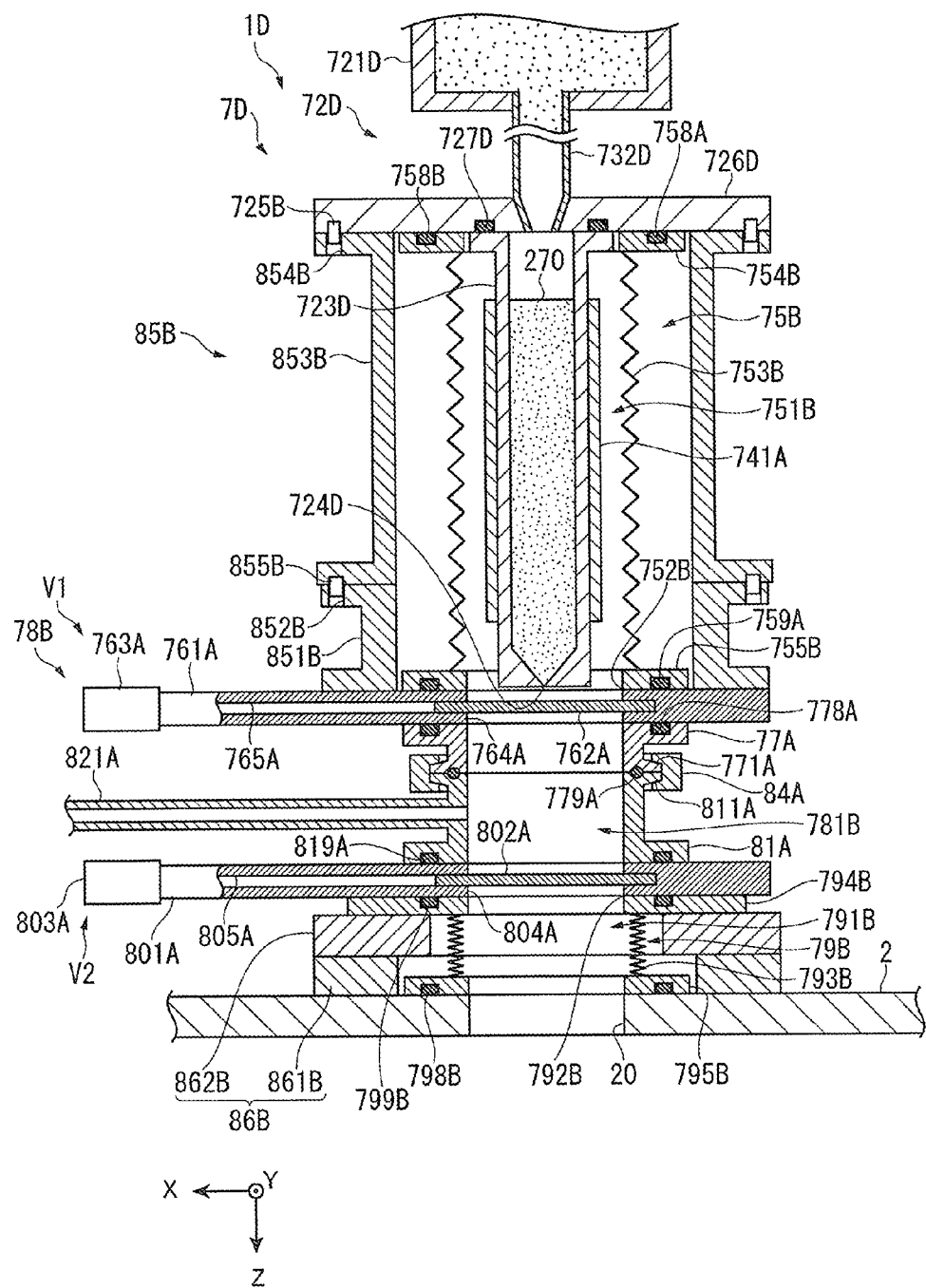
FIG. 10A illustrates the overall configuration of a target supply apparatus according to a fourth embodiment, and illustrates a state in which the target supply apparatus is mounted.
Figure 10B:
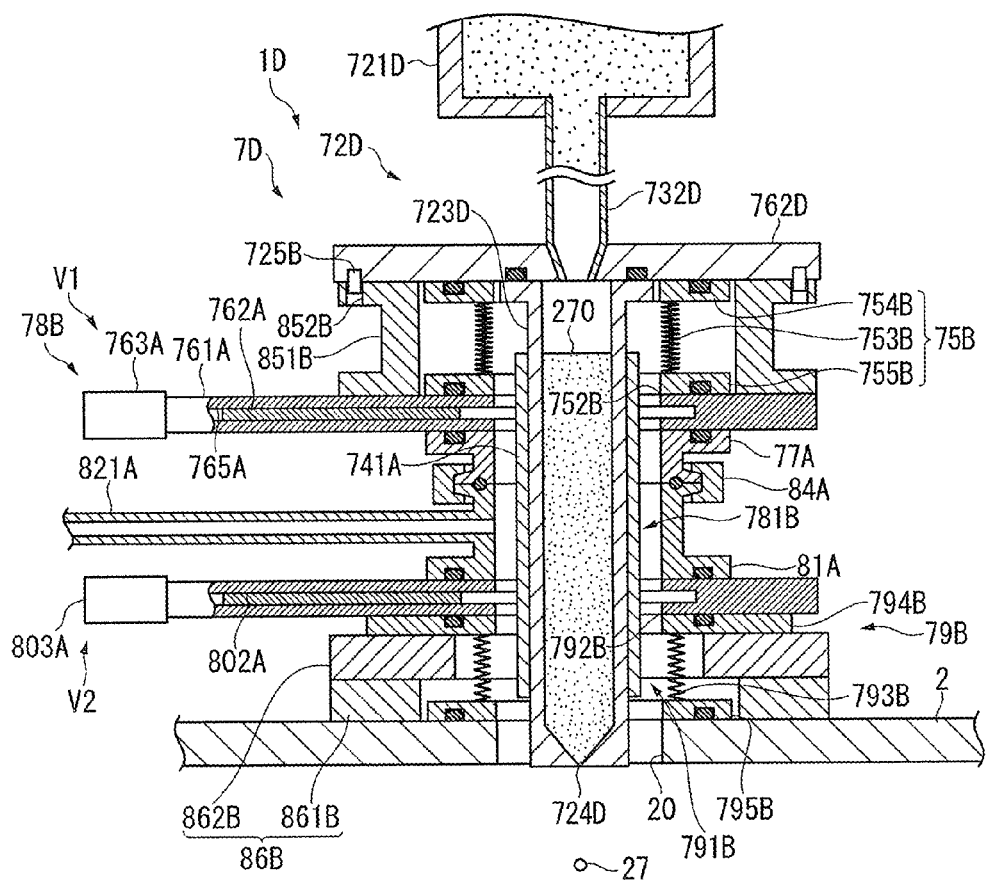
FIG. 10B illustrates the overall configuration of a target supply apparatus, and illustrates a state in which the target supply apparatus is operating.

FIG. 10A illustrates the overall configuration of a target supply apparatus according to the fourth embodiment, and illustrates a state in which the target supply apparatus is mounted. FIG. 10B illustrates the overall configuration of the target supply apparatus, and illustrates a state in which the target supply apparatus is operating.

The configuration of an EUV light generation apparatus 1D according to the fourth embodiment may, as shown in FIG. 10A, be the same as that of the EUV light generation apparatus 1B of the second embodiment, with the exception of a target generator 72D in a target supply apparatus 7D. The difference between the configuration shown in FIG. 10A and the configuration shown in FIG. 6A lies in a nozzle 723D having a single thickness but the tank 721A having a different thickness from that of the nozzle 723A in FIG. 6A.

The target generator 72D may include a tank 721D that contains the target material 270, and the cylindrical nozzle 723D that is connected to the tank 721D via a pipe 732D. A cap portion 726D that shuts an opening of a first surface of the nozzle 723D may be anchored onto that surface. Here, a seal may be formed between a first surface of the cap portion 726D and the first surface of the nozzle 723D by embedding an O-ring 727D in a groove provided in the cap portion 726D.

The heater 741A may be provided on an outer circumferential surface of the nozzle 723D.

The pipe 732D may be connected to the center of the cap portion 726D. The anchoring portion 754B may be anchored to the first surface of the cap portion 726D so as to surround the nozzle 723D. Here, a seal may be formed by the O-ring 758A between the first surface of the cap portion 726D and a first surface of the anchoring portion 754B.

Because the aforementioned seal structure is formed, the first internal space 751B in the first pipe 75B can be made airtight when the cover opening 752B of the first pipe 75B is closed by the first valve V1.

The positioning pins 725B may be provided on an outer edge of the first surface of the cap portion 726D. The target generator 72D can be suppressed from rotating relative to the first spacer 853B and the second spacer 851B by fitting the positioning pins 725B into the positioning holes 854B, as shown in FIG. 10A. Furthermore, in the case where the first spacer 853B is removed and the target generator 72D has been moved in the Z direction, the target generator 72D can be prevented from rotating relative to the second spacer 851B by fitting the positioning pins 725B into the positioning holes 852B, as shown in FIG. 10B.

2.4.3 Operation

2.4.3.1 Operations when Installing Target Generator in Chamber

In the following, descriptions of operations identical to those in the second embodiment will be omitted.

The operator may use, for example, a lifter (not shown) to move, in the −Z direction, an installation unit configured by joining the second pipe 77A, the first valve V1, the second spacer 851B, and the target generator 72D that has been placed upon the first surface of the spacer 851B via the first spacer 853B, in that order, as shown in FIG. 10A. Operating the lifter, the operator may then place the second pipe 77A of the installation unit on the fourth pipe 81A, and then position and anchor the second pipe 77A and the fourth pipe 81A to each other using the joint 84A. The airtight second internal space 781B can be formed as a result of this anchoring.

The EUV light generation control system of the EUV light generation apparatus may then perform the processes illustrated in FIG. 4 based on operations performed by the operator.

Through the aforementioned processes, the target generator 72D can be installed in the chamber 2 with both the first internal space 751B and the second internal space 781B being exhausted and without a nozzle hole 724D of the nozzle 723D making contact with air.

After this, the operator may move only the target generator 72D of the installation unit in the −Z direction using, for example, the lifter, and may remove the positioning pins 725B from the positioning holes 854B in the first spacer 853B. The operator may then remove the first spacer 853B from the second spacer 851B. Thereafter, the operator may move the target generator 72D in the Z direction using the lifter, and may fit the positioning pins 725B into the positioning holes 852B in the second spacer 851B.

Through these processes, the leading end of the nozzle 723D can be positioned inside of the chamber 2, as shown in FIG. 10B.

2.4.3.2 Operations when Removing Target Generator from Chamber

The operator may move only the target generator 72D in the −Z direction using the lifter, and may remove the positioning pins 725B from the positioning holes 852B in the second spacer 851B. The operator may then move the target generator 72D in the −Z direction to a position where the first spacer 853B can be installed between the target generator 72D and the second spacer 851B, install the first spacer 853B between the target generator 72D and the second spacer 851B, and fit the positioning pins 725B into the positioning holes 852B in the second spacer 851B. Thereafter, the operator may move the target generator 72D in the −Z direction using the lifter, and may fit the positioning pins 725B into the positioning holes 854B in the first spacer 853B, as shown in FIG. 10A.

The operator may then remove the joint 84A and remove the installation unit, including the target generator 72D, from the chamber 2 using the lifter. At this time, the first valve V1 is closed, and thus the target generator 72D can be removed from the chamber 2 without the nozzle hole 724D of the nozzle 723D making contact with air. In addition, the second valve V2 is closed, and thus air can be suppressed from entering into the chamber 2.

As described thus far, the target supply apparatus 7D may include the cylindrical first pipe 75B that extends from the cap portion 726D to the leading end of the nozzle 723D. In addition, the first pipe 75B may be provided so that the first internal space 751B is airtight when the first valve V1 closes the cover opening 752B.

Through this, the target generator 72D can be removed from the chamber 2 while suppressing the nozzle 723D from coming into contact with air.

The heater 741A may be provided on a side surface of the nozzle 723D so as to be positioned within the first internal space 751B.

Through this, the operator can be suppressed from making contact with the heater 741A. Furthermore, because the first internal space 751B can be in a vacuum state, an insulating effect can be achieved.

2.5 Variations

Note that the following configurations may be employed as the target supply apparatus.

Figure 11A:
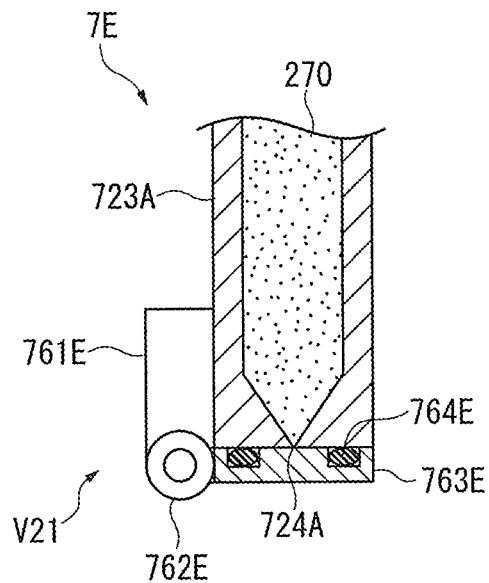
FIG. 11A illustrates the overall configuration of a target supply apparatus according to a variation, and illustrates a state in which a nozzle hole is closed.
Figure 11B:
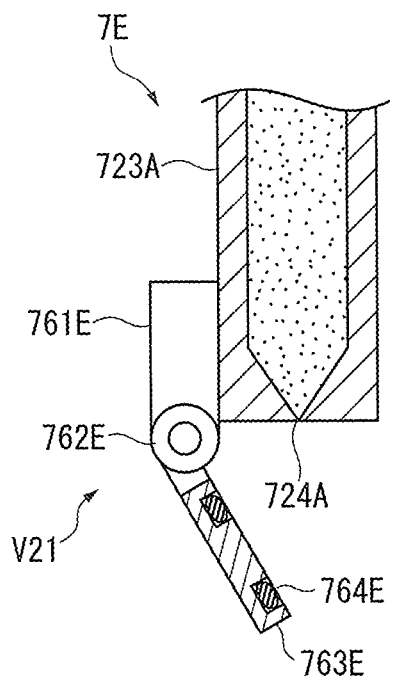
FIG. 11B illustrates the overall configuration of a target supply apparatus, and illustrates a state in which a nozzle hole is open.

FIG. 11A illustrates the overall configuration of a target supply apparatus according to a variation, and illustrates a state in which a nozzle hole is closed. FIG. 11B illustrates the overall configuration of the target supply apparatus, and illustrates a state in which the nozzle hole is open.

As shown in FIG. 11A, a target supply apparatus 7E may include a valve V21 serving as a nozzle hole opening/closing portion. The valve V21 may include an attachment portion 761E attached to a side surface on the leading end side of the nozzle 723A and a blocking portion 763E provided so as to be capable of rotating freely along the guide portion 761A (see FIG. 3) via an axial support portion 762E. The blocking portion 763E may serve as a cover opening/closing section.

Through this configuration, the nozzle hole 724A can be closed by the leading end surface of the nozzle 723A and the blocking portion 763E coming into tight contact, as shown in FIG. 11A. Even in the case where, for example, the target material adheres to the leading end of the nozzle 723A, the target material can be suppressed from scattering by the valve V21 closing the nozzle hole 724A. Here, a seal may be formed between the nozzle 723A and the blocking portion 763E by embedding an O-ring 764E in a groove provided in the blocking portion 763E on the opposite side as the nozzle 723A. In addition, as shown in FIG. 11B, a state in which a droplet (not shown) can be outputted can be achieved by rotating the blocking portion 763E and opening the nozzle hole 724A, as shown in FIG. 11B.

The above-described embodiments and the modifications thereof are merely examples for implementing the present disclosure, and the present disclosure is not limited thereto. Making various modifications according to the specifications or the like is within the scope of the present disclosure, and other various embodiments are possible within the scope of the present disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as "at least one" or "one or more".

What is claimed is:

1. A target supply apparatus mounted in a chamber in which extreme ultraviolet light is generated by introducing a target material and a laser beam into the chamber, the apparatus comprising:
   a target generator including a nozzle;
   a cover configured to cover the nozzle;
   a cover opening provided in the cover to allow the target material to pass through the cover; and
   a cover opening/closing section configured to open and close the cover opening.

2. The target supply apparatus according to claim 1,
   wherein the target generator includes a tank capable of holding the target material in the tank and the nozzle provided so as to communicate with the interior of the tank and protrude from a surface of the tank; and
   the cover is formed as a cylinder extending from the tank to a leading end of the nozzle, and an internal space surrounded by the cover, the cover opening/closing section, and the tank is made airtight by the cover opening/closing section closing the cover opening.

3. The target supply apparatus according to claim 2,
   wherein the cover is configured to be capable of extending and retracting in an axial direction of the nozzle; and
   the cover opening is formed at a size that enables the nozzle to be passed into the cover opening.

4. The target supply apparatus according to claim 1,
   wherein the target generator includes a tank capable of holding the target material, a cap portion that shuts an end of the nozzle on the opposite side to a nozzle hole, and a pipe that is connected to the tank and the cap portion so that the interior of the tank and the interior of the nozzle communicate; and
   the cover is formed as a cylinder extending from the cap portion to a leading end of the nozzle, and an internal space surrounded by the cover, the cover opening/closing section, and the cap portion is made airtight by the cover opening/closing section closing the cover opening.

5. The target supply apparatus according to claim 4,
   wherein the cover is configured to be capable of extending and retracting in an axial direction of the nozzle; and
   the cover opening is formed at a size that enables the nozzle to be passed into the cover opening.

6. The target supply apparatus according to claim 1, further comprising:
   a first connecting pipe provided so as to communicate with the interior of the cover via the cover opening;
   a second connecting pipe provided in the first connecting pipe in a removable state, so as to communicate with the interior of the first connecting pipe;
   a chamber opening, provided on an end of the second connecting pipe on the opposite side to the first connecting pipe, configured to introduce the target material;
   a chamber opening/closing section configured to open and close the chamber opening; and
   an exhaust section configured to exhaust the interior of the first connecting pipe, the interior of the second connecting pipe, and the interior of the cover.

7. The target supply apparatus according to claim 6, further comprising:
   a purge gas supply section configured to supply a purge gas to the interior of the first connecting pipe, the interior of the second connecting pipe, and the interior of the cover.

8. The target supply apparatus according to claim 6, further comprising:
   an anchoring portion configured to position and anchor the first connecting pipe and the second connecting pipe.

9. A target supply apparatus mounted in a chamber in which extreme ultraviolet light is generated by introducing a target material and a laser beam into the chamber, the apparatus comprising:
   a target generator including a nozzle; and
   a nozzle hole opening/closing portion configured to open and close a nozzle hole in the nozzle.

10. A chamber comprising:
    a chamber main body including a chamber opening;
    a target supply apparatus configured to introduce a target material into the chamber main body through the chamber opening; and
    a chamber opening/closing section configured to open and close the chamber opening.

11. An extreme ultraviolet light generation apparatus that generates extreme ultraviolet light by introducing a target material and a laser beam, the apparatus comprising:
    a target generator including a nozzle;
    a chamber main body including a chamber opening through which the target material is introduced;
    a chamber opening/closing section configured to open and close the chamber opening;
    a cover configured to cover the nozzle;
    a cover opening provided in the cover to allow the target material to pass through the cover; and
    a cover opening/closing section configured to open and close the cover opening.

* * * * *